US 12,215,420 B2

(12) United States Patent
Lind et al.

(10) Patent No.: US 12,215,420 B2
(45) Date of Patent: Feb. 4, 2025

(54) PEDESTAL THERMAL PROFILE TUNING USING MULTIPLE HEATED ZONES AND THERMAL VOIDS

(71) Applicant: LAM RESEARCH CORPORATION, Fremont, CA (US)

(72) Inventors: Gary B. Lind, Penn Valley, CA (US); Alok Mahadeva, Pune (IN)

(73) Assignee: Lam Research Corporation, Fremont, CA (US)

( * ) Notice: Subject to any disclaimer, the term of this patent is extended or adjusted under 35 U.S.C. 154(b) by 94 days.

(21) Appl. No.: 18/008,273

(22) PCT Filed: Jun. 4, 2021

(86) PCT No.: PCT/US2021/035835
§ 371 (c)(1),
(2) Date: Dec. 5, 2022

(87) PCT Pub. No.: WO2021/252276
PCT Pub. Date: Dec. 16, 2021

(65) Prior Publication Data
US 2023/0272529 A1    Aug. 31, 2023

Related U.S. Application Data

(60) Provisional application No. 63/036,650, filed on Jun. 9, 2020.

(51) Int. Cl.
*C23C 16/455* (2006.01)
*C23C 16/458* (2006.01)
(Continued)

(52) U.S. Cl.
CPC ...... *C23C 16/45544* (2013.01); *C23C 16/458* (2013.01); *C23C 16/52* (2013.01);
(Continued)

(58) Field of Classification Search
None
See application file for complete search history.

(56) References Cited

U.S. PATENT DOCUMENTS 5,882,417 A    3/1999  van de Ven et al.
6,054,688 A *  4/2000  Moschini ............... H05B 3/12
                                                   118/725
(Continued)

FOREIGN PATENT DOCUMENTS

JP    2001118915 A    4/2001
JP    2011049196 A    3/2011
JP    2013115352 A    6/2013

OTHER PUBLICATIONS

International Search Report and Written Opinion of the ISA issued in PCT/US2021/035835, mailed Nov. 3, 2021; ISA/KR.

*Primary Examiner* — Alexander M Weddle

(57) ABSTRACT

A substrate support includes a body and a thermal void. The body is configured to support a substrate during processing of the substrate. The body includes plates including a top plate, a first intermediate plate, a second intermediate plate and a bottom plate. The plates are arranged to form a stack. The first intermediate plate is disposed on the second intermediate plate. The thermal void is defined by an upper surface of the second intermediate plate and at least one of a lower surface of the first intermediate plate or a lower surface of the top plate. The thermal void is annular-shaped.

21 Claims, 13 Drawing Sheets

(51) Int. Cl.
*C23C 16/52* (2006.01)
*H01J 37/32* (2006.01)

(52) U.S. Cl.
CPC . *H01J 37/32724* (2013.01); *H01J 2237/2001* (2013.01); *H01J 2237/3321* (2013.01)

(56) References Cited

U.S. PATENT DOCUMENTS

| | | | |
|---|---|---|---|
| 6,138,745 A * | 10/2000 | Moslehi | H01L 21/68785 |
| | | | 118/728 |
| 2014/0209596 A1 | 7/2014 | Lubomirsky et al. | |
| 2015/0380220 A1* | 12/2015 | Tan | H01J 37/32724 |
| | | | 219/443.1 |
| 2016/0352260 A1 | 12/2016 | Comendant | |
| 2019/0198363 A1* | 6/2019 | Shimai | H01L 21/67109 |

* cited by examiner

PEDESTAL THERMAL PROFILE TUNING USING MULTIPLE HEATED ZONES AND THERMAL VOIDS

CROSS-REFERENCE TO RELATED APPLICATIONS

This application is a U.S. National Phase Application under 35 U.S.C. 371 of International Application No. PCT/US2021/035835, filed on Jun. 4, 2021, which claims the benefit of U.S. patent application Ser. No. 63/036,650 filed on Jun. 9, 2020. The entire disclosures of the above applications are incorporated herein by reference.

FIELD

The present disclosure relates to pedestals for supporting and heating a substrate during processing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate support (e.g., a pedestal) includes a body on which a substrate can be held by vacuum clamping. A heating element can be disposed in the body to heat the pedestal and as a result the substrate during processing. Power is supplied to the heating element via a support column of the substrate support. The body and heating element are typically designed to provide uniform heating across the substrate.

SUMMARY

A substrate support is provided and includes a body and a thermal void. The body is configured to support a substrate during processing of the substrate. The body includes plates including a top plate, a first intermediate plate, a second intermediate plate and a bottom plate. The plates are arranged to form a stack. The first intermediate plate is disposed on the second intermediate plate. The thermal void is defined by an upper surface of the second intermediate plate and at least one of a lower surface of the first intermediate plate or a lower surface of the top plate. The thermal void is annular-shaped.

In other features, each of the plates is bonded to one or more of the plates.

In other features, the plates are bonded together to form a unitary structure with at least partially sealed passages. Thermal conductivity exists between the plates due to the unitary structure.

In other features, the thermal void is defined by the lower surface of the first intermediate plate and the upper surface of the second intermediate plate.

In other features, the first intermediate plate includes a first channel including a first pair of opposing side surfaces. The lower surface of the first intermediate plate extends between the first pair of opposing side surfaces. The second intermediate plate includes a second channel including a second pair of opposing side surfaces. The upper surface of the second intermediate plate extends between the second pair of opposing side surfaces.

In other features, the thermal void is defined by the lower surface of the top plate and the upper surface of the second intermediate plate.

In other features, the first intermediate plate includes a first channel including a first pair of opposing side surfaces. The lower surface of the top plate extends between the first pair of opposing side surfaces. The second intermediate plate includes a second channel includes a second pair of opposing side surfaces. The upper surface of the second intermediate plate extends between the second pair of opposing side surfaces.

In other features, the thermal void is a first thermal void. The first thermal void is defined by the lower surface of the first intermediate plate and the upper surface of the second intermediate plate. The body includes a second thermal void defined by the lower surface of the top plate and the upper surface of the second intermediate plate.

In other features, the body includes a third thermal void. The third thermal void is annular shaped.

In other features, the thermal void is a first thermal void. The substrate support includes one or more thermal voids including the first thermal void. Dimensions of the one or more thermal voids relative to dimensions of at least some of the plates provides a temperature gradient of greater than 2° C. between a center and an annular outer peripheral area of the body.

In other features, the thermal void is a first thermal void. The substrate support includes one or more thermal voids including the first thermal void. Dimensions of the one or more thermal voids relative to dimensions of at least some of the plates provides a temperature gradient of greater than or equal to 6° C. between a center and an annular outer peripheral area of the body.

In other features, the thermal void is defined by three of the plates.

In other features, the thermal void is a first thermal void. The body includes a second thermal void. The second thermal void is annular-shaped and defined by a corresponding two or more of the plates.

In other features, the plates include first radially-extending channels and second radially-extending channels. The thermal void transfers an exclusion gas between the first radially extending channels and the second radially extending channels.

In other features, the body includes another thermal void. The another thermal void is annular-shaped and transfers the exclusion gas between the second radially extending channels and at least one of holes in the plates and an exclusion gas groove.

In other features, the plates include radially-extending channels and radially-extending grooves. The thermal void transfers gas under vacuum between the radially extending channels and the radially extending grooves.

In other features, the body includes another thermal void. The another thermal void is annular-shaped and transfers gas under vacuum between the radially extending channels and at least one of holes and vacuum grooves in the plates.

In other features, the thermal void is a first thermal void. The body includes four annular-shaped thermal voids arranged in a concentric pattern. The four annular-shaped thermal voids include the first thermal void.

In other features, the plates include two or more concentric heating coils.

In other features, the plates include an inner heating element, a middle heating element and an outer heating element. The thermal void is a first thermal void. The body includes a second thermal void. The first thermal void is disposed above an area between the outer heating element and the middle heating element. The second thermal void is disposed above an area between the middle heating element and the inner heating element.

In other features, heights of cross-sections of the first thermal void and the second thermal void are different.

In other features, widths of cross-sections of the first thermal void and the second thermal void are different.

In other features, a height of a cross-section of the first thermal void is defined by three of the plates. A height of a cross-section of the second thermal void is defined by two of the plates.

In other features, a height of a cross-section of the first thermal void is greater than a height of a cross-section of the second thermal void.

In other features, a width of the second thermal void is greater than a width of the first thermal void.

In other features, a system is provided and includes the substrate support and a control module. The substrate support includes two or more heating elements and one or more sensors. The one or more sensors is configured to generate one or more temperature signals. The control module is configured, based on the one or more temperature signals and a relationship between the thermal void and at least some of the plates, control supply of at least one of current or power to the two or more heating elements.

In other features, a substrate support is provided and includes a body and a thermal void. The body is configured to support a substrate during processing of the substrate. The body includes plates including a top plate, one or more intermediate plates, and a bottom plate. The plates are arranged to form a stack. The thermal void is defined by two or more of the plates including at least one of the one or more intermediate plates. The thermal void is annular-shaped and concentric with the two or more of the plates.

In other features, each of the plates is bonded to one or more of the plates.

In other features, the plates are bonded together to form a unitary structure with at least partially sealed passages. Thermal conductivity exists between the plates due to the unitary structure.

In other features, the thermal void is a first thermal void. The body includes a second thermal void. The second thermal void is concentric with the first thermal void.

In other features, the body includes a third thermal void. The third thermal void is concentric with the first thermal void and the second thermal void.

In other features, the thermal void is a first thermal void. The substrate support includes one or more thermal voids including the first thermal void. Dimensions of the one or more thermal voids relative to dimensions of at least some of the plates provides a temperature gradient of greater than 2° C. between a center and an annular outer peripheral area of the body.

In other features, the thermal void is a first thermal void. The substrate support includes one or more thermal voids including the first thermal void. Dimensions of the one or more thermal voids relative to dimensions of at least some of the plates provides a temperature gradient of greater than or equal to 6° C. between a center and an annular outer peripheral area of the body.

In other features, the thermal void is defined by three of the plates.

In other features, the thermal void is a first thermal void. The body includes a second thermal void. The second thermal void is annular-shaped and defined by a corresponding two or more of the plates.

In other features, the plates include first radially-extending channels and second radially-extending channels. The thermal void transfers an exclusion gas between the first radially extending channels and the second radially extending channels.

In other features, the body includes another thermal void. The another thermal void is annular-shaped and transfers the exclusion gas between the second radially extending channels and at least one of holes in the plates and an exclusion gas groove.

In other features, the plates include radially-extending channels and radially-extending grooves. The thermal void transfers gas under vacuum between the radially extending channels and the radially extending grooves.

In other features, the body includes another thermal void. The another thermal void is annular-shaped and transfers gas under vacuum between the radially extending channels and at least one of holes and vacuum grooves in the plates.

In other features, the thermal void is a first thermal void. The body includes four annular-shaped thermal voids arranged in a concentric pattern. The four annular-shaped thermal voids include the first thermal void.

In other features, the plates include two or more concentric heating coils.

In other features, the plates include an inner heating element, a middle heating element and an outer heating element. The thermal void is a first thermal void. The body includes a second thermal void. The first thermal void is disposed above an area between the outer heating element and the middle heating element. The second thermal void is disposed above an area between the middle heating element and the inner heating element.

In other features, heights of cross-sections of the first thermal void and the second thermal void are different.

In other features, widths of cross-sections of the first thermal void and the second thermal void are different.

In other features, a height of a cross-section of the first thermal void is defined by three of the plates. A height of a cross-section of the second thermal void is defined by two of the plates.

In other features, a height of a cross-section of the first thermal void is greater than a height of a cross-section of the second thermal void.

In other features, a width of the second thermal void is greater than a width of the first thermal void.

In other features, a system is provided and includes the substrate support and a control module. The substrate support includes two or more heating elements and one or more sensors. The one or more sensors is configured to generate one or more temperature signals. The control module is configured, based on the one or more temperature signals and a relationship between the thermal void and at least some of the plates, control supply of at least one of current or power to the two or more heating elements.

In other features, a substrate support is provided and includes a body and a thermal void. The body is configured to support a substrate during processing of the substrate. The body includes plate layers including a top plate layer, one or more intermediate plate layers, and a bottom plate layer. The one or more intermediate plate layers include a first plate and a second plate. The second plate is concentric with the first plate. The plate layers are arranged to form a stack. The thermal void is defined at least partially by the first plate and the second plate. The thermal void is annular-shaped.

In other features, each of the plates is bonded to one or more of the plate layers.

In other features, the plate layers are bonded together to form a unitary structure with at least partially sealed passages. Thermal conductivity exists between the plate layers due to the unitary structure.

In other features, the thermal void is further defined by the top plate layer.

In other features, the thermal void is further defined by a third plate. The one or more intermediate plate layers includes the third plate.

In other features, the first plate and the second plate are disposed on and in contact with the third plate.

In other features, the thermal void is concentric with the first plate and the second plate.

In other features, the thermal void is a first thermal void. The substrate support includes one or more thermal voids including the first thermal void. Dimensions of the one or more thermal voids relative to dimensions of at least some of the plate layers provides a temperature gradient of greater than 2° C. between a center and an annular outer peripheral area of the body.

In other features, the thermal void is a first thermal void. The substrate support includes one or more thermal voids including the first thermal void. Dimensions of the one or more thermal voids relative to dimensions of at least some of the plate layers provides a temperature gradient of greater than or equal to 6° C. between a center and an annular outer peripheral area of the body.

In other features, the thermal void is defined by three of the plate layers.

In other features, the thermal void is a first thermal void. The body includes a second thermal void. The second thermal void is annular-shaped and defined by a corresponding two or more of the plate layers.

In other features, the plate layers include first radially-extending channels and second radially-extending channels. The thermal void transfers an exclusion gas between the first radially extending channels and the second radially extending channels.

In other features, the body includes another thermal void. The another thermal void is annular-shaped and transfers the exclusion gas between the second radially extending channels and at least one of holes in the plate layers and an exclusion gas groove.

In other features, the plate layers include radially-extending channels and radially-extending grooves. The thermal void transfers gas under vacuum between the radially extending channels and the radially extending grooves.

In other features, the body includes another thermal void. The another thermal void is annular-shaped and transfers gas under vacuum between the radially extending channels and at least one of holes and vacuum grooves in the plate layers.

In other features, the thermal void is a first thermal void. The body includes four annular-shaped thermal voids arranged in a concentric pattern. The four annular-shaped thermal voids include the first thermal void.

In other features, the plate layers include two or more concentric heating coils.

In other features, the plate layers include an inner heating element, a middle heating element and an outer heating element. The thermal void is a first thermal void. The body includes a second thermal void. The first thermal void is disposed above an area between the outer heating element and the middle heating element. The second thermal void is disposed above an area between the middle heating element and the inner heating element.

In other features, heights of cross-sections of the first thermal void and the second thermal void are different.

In other features, widths of cross-sections of the first thermal void and the second thermal void are different.

In other features, a height of a cross-section of the first thermal void is defined by three of the plate layers. A height of a cross-section of the second thermal void is defined by two of the plate layers.

In other features, a height of a cross-section of the first thermal void is greater than a height of a cross-section of the second thermal void.

In other features, a width of the second thermal void is greater than a width of the first thermal void.

In other features, a system is provided and includes the substrate support and a control module. The substrate support includes two or more heating elements and one or more sensors. The one or more sensors is configured to generate one or more temperature signals. The control module is configured, based on the one or more temperature signals and a relationship between the thermal void and at least some of the plurality of plate layers, control supply of at least one of current or power to the two or more heating elements.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
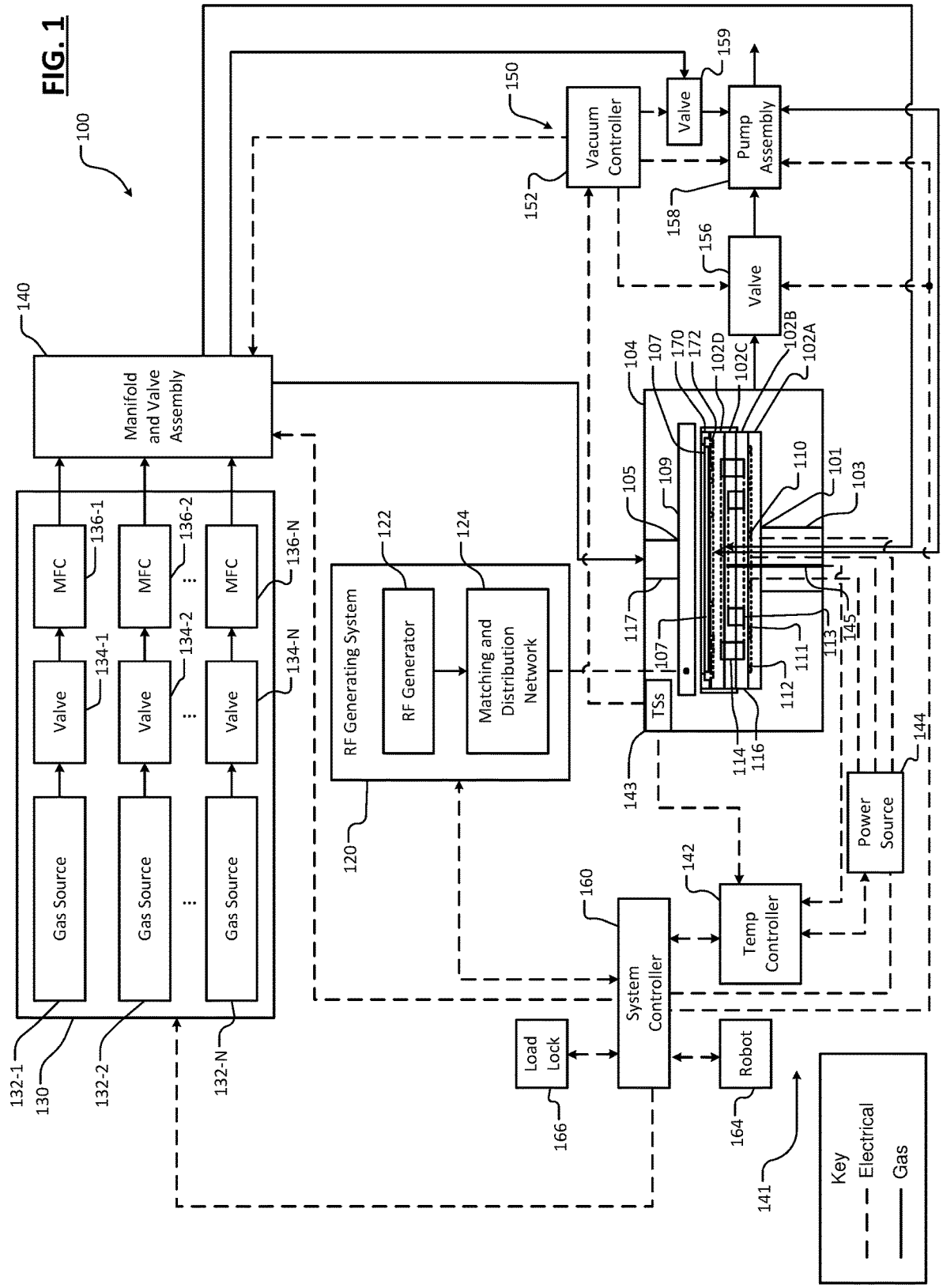
FIG. 1 is a functional block diagram of an example substrate processing system including a substrate support including thermal voids in accordance with an example of the present disclosure.

Certain substrate processes can exhibit too much deposition at an outer circumferential edge of a substrate. For example, an atomic layer deposition (ALD) process including reiterative process operations for depositing thin layers on a substrate can exhibit too much deposition on an outer circumferential edge of a substrate. The iterative process operations may include switching between (i) precursor and purge gas operations and (ii) hydrogen and purge gas operations. An ALD process may be used when filling features (e.g., vias, grooves, holes, etc.) in the substrate. The features may be features of, for example, three-dimensional (3D) NAND memory. In order to uniformly fill the features, the thin layers need to be uniformly deposited on the substrate from a center of the substrate to an outer circumferential edge of the substrate. During the ALD process, gas dynamics including vertically and radially flow process gases near the circumferential edge and entrapment from edge features can cause there to be a partial chemical vapor deposition (CVD) reaction rather than an ALD reaction. This can cause increased deposition at the circumferential edge. In order to maintain deposition uniformity, the amount of deposition at the outer circumferential edge may be reduced by lowering the temperature at the circumferential edge by, for example, heating the circumferential edge less than, for example, an area radially inward of the circumferential edge.

Other substrate processes can exhibit not enough deposition at an outer circumferential edge of the substrate. For example, during a CVD process, hydrogen gas and argon gas are used to protect the circumferential edge of the substrate. The gases can protect a circumferential edge of the substrate from deposition and have an effect on bulk deposition on the substrate and reduce the amount of deposition near the circumferential edge. This effect tends to exhibit deposition drop off at the outer circumferential edge resulting in a reduced amount of deposition at the circumferential edge. The stated effect can be compensated for by heating the circumferential edge more. In order to maintain deposition uniformity, the amount of deposition at the circumferential edge may be increased by heating the circumferential edge more than, for example, an area radially inward of the circumferential edge.

In order to better control temperatures across a substrate and allow a circumferential edge of a substrate to be heated differently than other areas of the substrate, a pedestal may include multiple heating elements. As an example, a pedestal may include a body (or platen) having multiple embedded heating elements, which are used to heat respective zones of the body and thus zones of a substrate supported by the body. The additional heating elements may be used to, for example, provide improved uniform heating across the body as compared to a pedestal including only a single heating element. One or more of the additional heating elements may disposed and operated for edge tuning purposes. For example, a first heating element disposed in a radially outer portion of the body may be used to provide a different amount of heat near an outer circumferential edge of a substrate as compared to another heating element disposed radially inward of the first heating element.

In order to compensate for deposition disparities during substrate processing, a large temperature gradient may be needed between, for example, an outer circumferential edge of the substrate and a center area of the substrate. The center area refers to the area radially inward of the outer circumferential edge. A platen including, for example, a solid aluminum body with multiple embedded heating elements has a limited ability to provide an adequate temperature gradient between the center area and the circumferential edge.

The examples set forth herein include substrate supports including multiple heating elements and multiple thermal voids. The thermal voids include manifold-shaped voids (hereinafter referred to as "manifolds") defined by plates of the substrate supports. The manifolds are annular open areas within the plates. Each manifold may be defined by one or more plates. The manifolds have corresponding main annular chambers with input and output channels, ports, and/or grooves. The thermal voids aid in increasing temperature gradients between different areas of the substrate supports.

FIG. 1 shows a substrate processing system 100 that includes a substrate support 101, shown as a pedestal. The substrate support 101 may be configured the same or similarly as any of the substrate supports disclosed herein including any of the features shown in FIGS. 2-11B. Although FIG. 1 shows a capacitive coupled plasma (CCP) system, the embodiments disclosed herein are applicable to transformer coupled plasma (TCP) systems, inductively coupled plasma (ICP) systems and/or other systems and plasma sources that include a substrate support. The embodiments are applicable to chemical vapor deposition (CVD) processes, atomic layer deposition (ALD) processes, and/or other processes where zonal heating along with large temperature gradients across a substrate support are applicable. The CVD and ALD processes are mentioned as examples only, the embodiments disclosed herein are applicable to other processes with large temperature gradients. In the example shown, the substrate support 101 includes a body 102 and a support column (or stem) 103. The body 102 including multiple plates 102A-D, which may be formed of, for example, aluminum (Al). In one embodiment, the body 102 is a brazed aluminum platen that includes multiple plates. In the example shown, the body 102 includes plate layers 102A, 102B, 102C and 102D. Each of the plate layers 102A, 102B, 102C and 102D includes one or more plates. For example, in one embodiment, the plate layers 102A, 102B and 102D include a single plate and plate layer 102C includes two plates, an inner plate and an outer plate. The plates of the plate layers 102A, 102B, 102C and 102D are further shown and described with respect to FIGS. 8A-11B.

The substrate processing system 100 includes a processing chamber 104. The substrate support 101 is enclosed within the processing chamber 104. The processing chamber 104 also encloses other components, such as an upper electrode 105, and contains RF plasma. During operation, a substrate 107 is arranged on and clamped to the substrate support 101. For example only, the upper electrode 105 may include a showerhead 109 that introduces and distributes gases. The showerhead 109 may include a stem portion 117 including one end connected to a top surface of the processing chamber 104. The showerhead 109 is generally cylindrical and extends radially outward from an opposite end of the stem portion 117 at a location that is spaced from the top surface of the processing chamber 104. A substrate-facing surface of the showerhead 109 includes holes through which process or purge gas flows. Alternately, the upper electrode 105 may include a conducting plate and the gases may be introduced in another manner.

Figure 6:
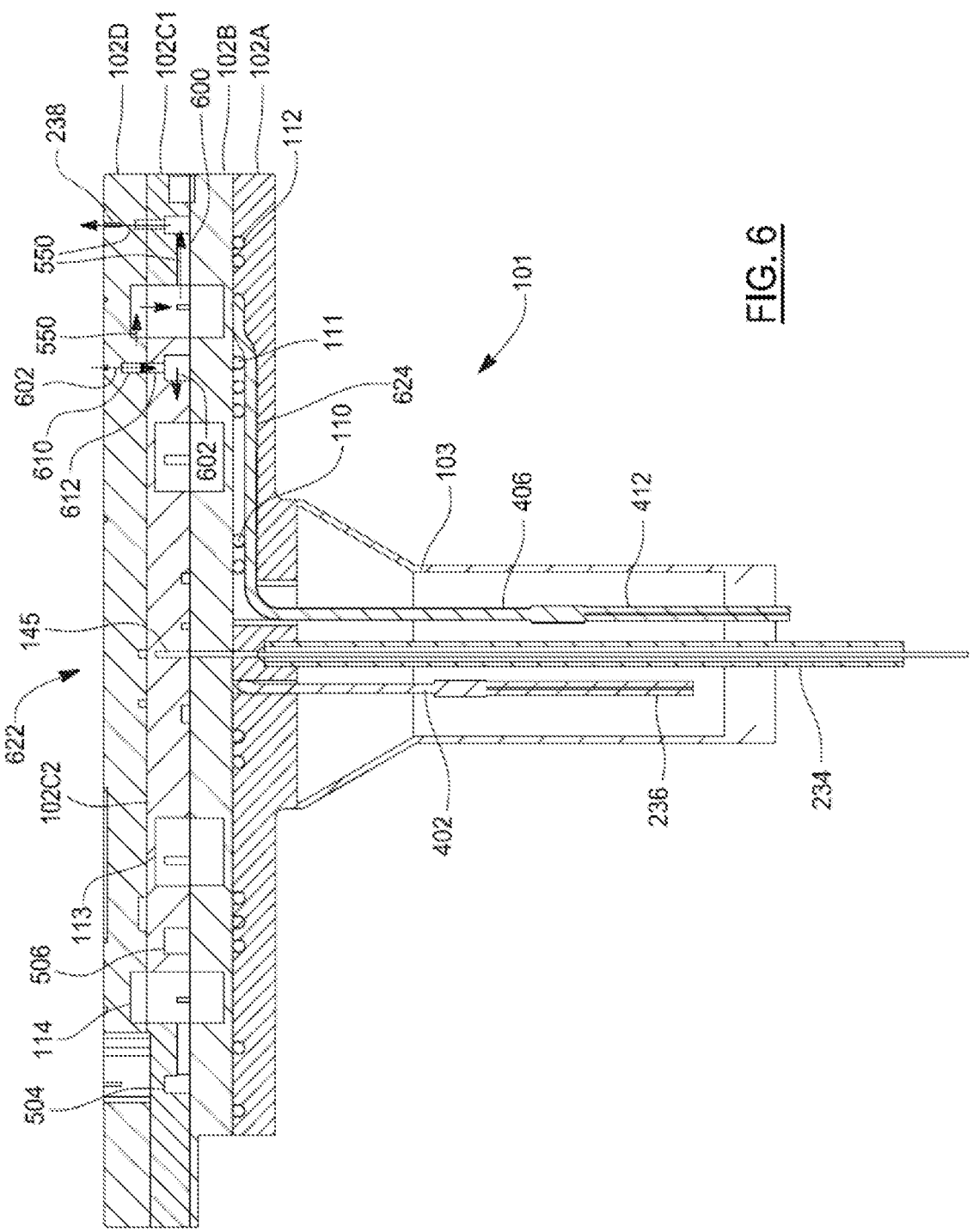
FIG. 6 is a cross-sectional view of the substrate support of FIG. 1 illustrating thermal voids and portions of the exclusion zone gas path and a vacuum path in accordance with an example of the present disclosure.
Figure 7:
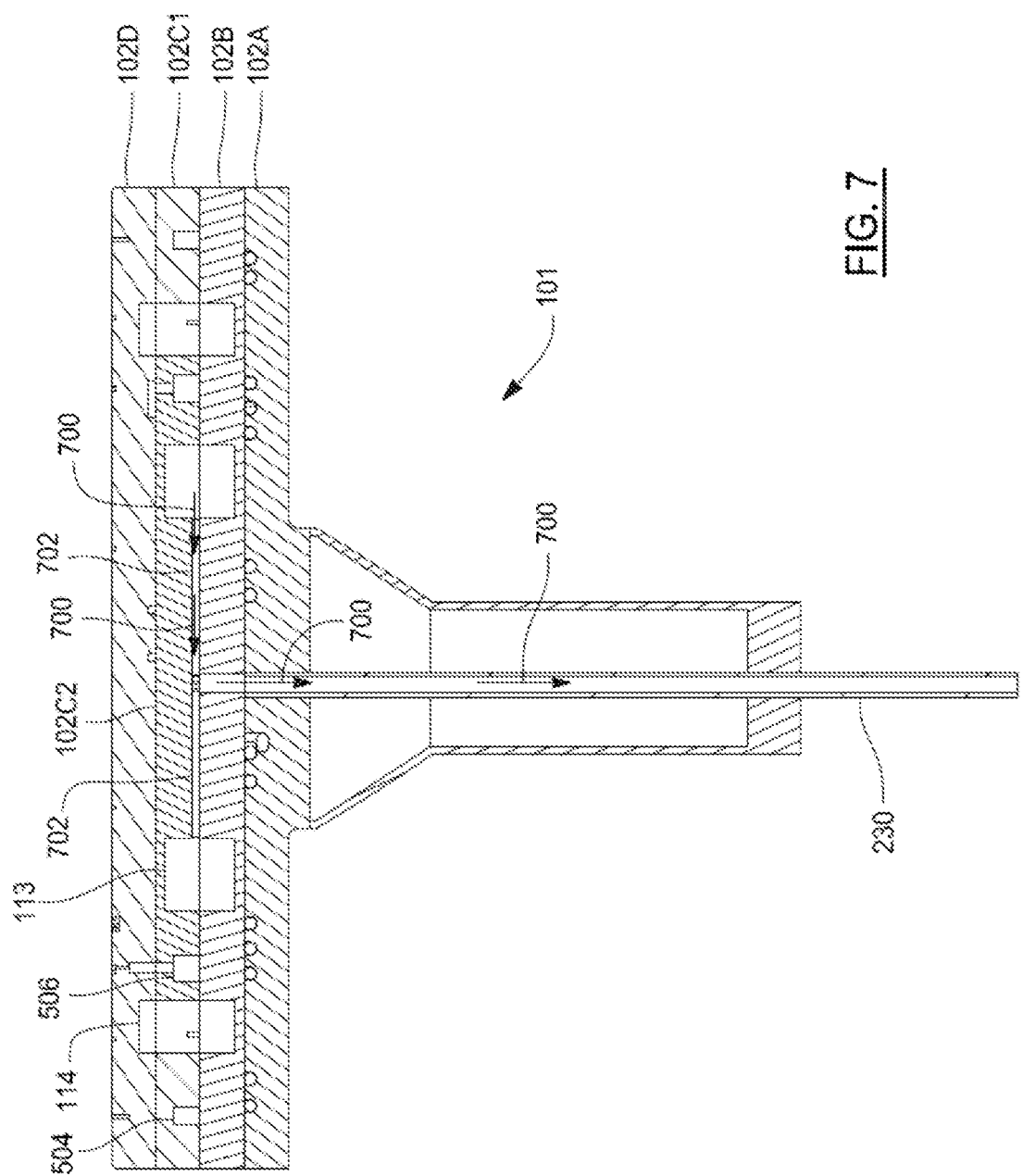
FIG. 7 is a cross-sectional view of the substrate support of FIG. 1 illustrating a portion of the vacuum path in accordance with an example of the present disclosure.
Figure 8A:
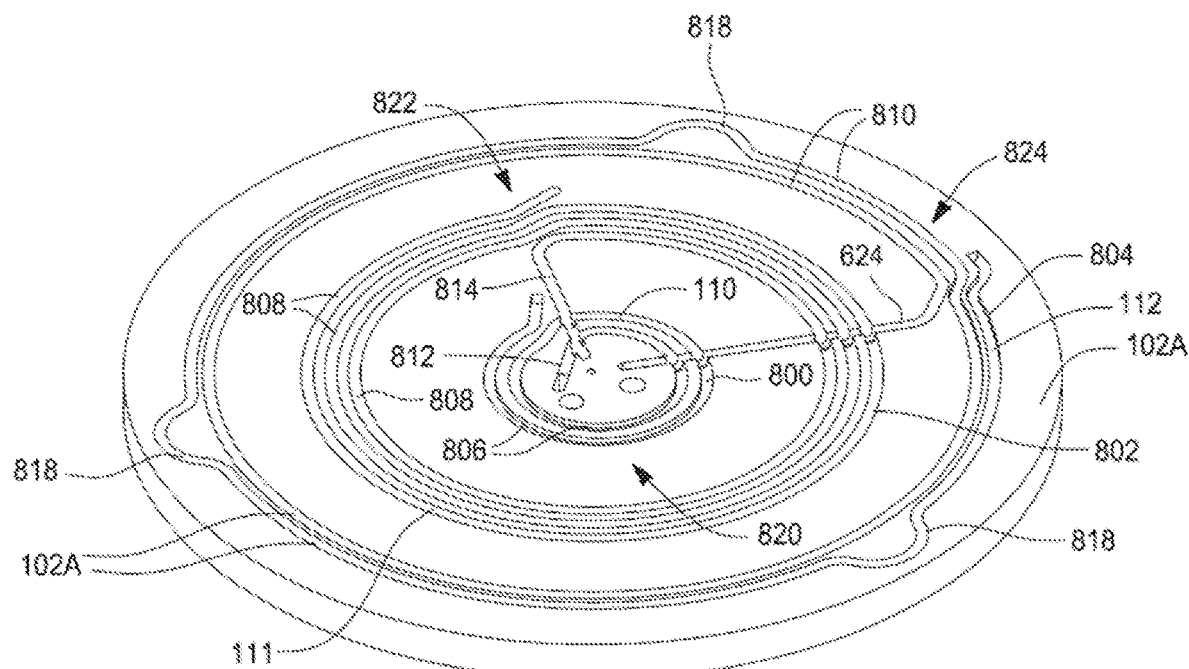
FIG. 8A is a top perspective view of a bottom plate layer of the substrate support of FIG. 1 in accordance with an example of the present disclosure.

The substrate support 101 includes two or more heating elements (three are shown in FIG. 1 and designated 110, 111, 112), which in the example shown are implemented in the bottom plate 102A. The heating elements may include concentric coils, each of which having multiple windings, where each winding may be circular-shaped. Each of the coils may be referred to as a heater. Examples of the coils are shown in FIG. 8A. The heating elements receive power and heat the substrate support 101 as further described below. The substrate support further includes one or more thermal voids (two are shown in FIG. 1 and designated 113, 114). Although not shown in FIG. 1, the substrate support 101 may include other thermal voids, which are shown in FIGS. 5-7, 9A, 10A, and 11A. The thermal voids provide thermal breaks where temperature drops off, which increases temperature gradients radially across the substrate support.

The thermal voids 113, 114 are shown above areas between the heating elements 110, 111, 112. The heating elements may have different sizes, shapes and provide corresponding heating patterns and be allocated to respective heating zones of the substrate support 101. Although three heating elements and two thermal voids are shown in FIG. 1, the substrate support may have a different number of heating elements and/or thermal voids. The thermal voids may have different sizes, shapes and patterns. The thermal voids increase temperature gradients between an outer circumferential edge (or periphery) 116 of the body 102 and a center area of the body 102.

The substrate support 101 includes channels, thermal voids, holes, and grooves for providing vacuum between a backside of the substrate 107 and a top surface of the substrate support 101. One of the thermal voids is designated 113. Additional channels, thermal voids, holes, and grooves are included and used to supply exclusion gas to the outer circumferential edge of the substrate 107. One of the thermal voids used to supply exclusion gas is designated 114. Examples of the channels, the thermal voids, the holes, and the grooves are shown in FIGS. 2-11B.

An RF generating system 120 generates and outputs RF voltages to the upper electrode 105 and a lower electrode, which may be the body 102. One of the upper electrode 105 and the substrate support 101 may be DC grounded, AC grounded or at a floating potential. For example only, the RF generating system 120 may include an RF generator 122 (e.g., a capacitive coupled plasma RF power generator) that generates RF voltages, which are fed by a matching and distribution network 124 to the upper electrode 105 and/or the substrate support 101. An electrode that receives an RF signal, an RF voltage and/or RF power is referred to as a RF electrode.

A gas delivery system 130 includes one or more gas sources 132-1, 132-2, ..., and 132-N (collectively gas sources 132), where N is an integer greater than zero. The gas sources 132 supply one or more precursors and gas mixtures thereof. The gas sources 132 may also supply etch gas, carrier gas and/or purge gas. Vaporized precursor may also be used. The gas sources 132 are connected by valves 134-1, 134-2, ..., and 134-N (collectively valves 134) and mass flow controllers 136-1, 136-2, ..., and 136-N (collectively mass flow controllers 136) to a manifold and valve assembly 140. An output of the manifold and valve assembly 140 is fed to the processing chamber 104. For example only, the output of the manifold and valve assembly 140 is fed to the showerhead 109.

The substrate processing system 100 further includes a heating system 141 that includes a temperature controller 142, which may be connected to the heating elements 110. The temperature controller 142 controls a power source 144, which supplies power to the heating elements 110. Although shown separately from a system controller 160, the temperature controller 142 may be implemented as part of the system controller 160. The substrate support 101 may include multiple temperature controlled zones. One or more of the zones may include a temperature sensor and a corresponding heating element. In one embodiment, a thermocouple is included in a center zone and not in an annular middle zone and a radially outermost zone. In another embodiment, a thermocouple is included in each of the three zones. The substrate support 101 may include two or more temperature-controlled zones. An example thermocouple 145 is shown. The thermocouple 145 and/or other thermocouples incorporated in the substrate support 101 may be bayonet style thermocouples.

The temperature controller 142 may monitor temperatures of the substrate support 101 as indicated by the temperature sensors and adjust current, voltage and/or power to the heating elements to adjust the temperatures of the substrate support 101 to match target temperatures. The current, voltage and/or power may be controlled based on known dimensions and locations of the thermal voids in the substrate support 101 including the dimensions and locations of the thermal voids 113, 114.

As an example, the substrate support 101 may include the three heating elements 110, 111, 112, referred to as a center (or inner) heating element, a middle heating element and an outer heating element. The heating elements 110, 111, 112 may be ring-shaped. The outer heating element 112 may surround the middle heating element 111, which may surround the inner heating element 110. This provides a ring-shaped outer zone, a ring-shaped middle zone and a ring-shaped inner zone. The heating elements 110, 111, 112 may be circular-shaped and/or have other geometric patterns.

In one embodiment, the temperature controller 142 monitors a temperature of a first zone (e.g., the center zone) and adjusts current and/or power to the inner heating element 110 based on a target temperature for the first zone. The temperature controller 142 may adjusts current and/or power to other zones (e.g., the middle annular zone and the radially outermost zone) based on the current and/or power to the first zone. The adjustment in current and power to the other zones may be for example the current and power supplied to the heating elements 111, 112. In one embodiment, the middle and outer zones are slaved off the center zone. The slaved values (e.g., current and power) for the middle and outer zones may be: predetermined percentages of the values (e.g., current and power) of the center zone; determined using an algorithm and/or mathematical equations; determined using look-up tables; and/or determined via other methods. The current and power values for the zones may be determined based on a process recipe. The power source 144 may be controlled by the temperature controller 142 and/or system controller 160.

The temperature controller 142 may control operation and thus temperatures of heating elements and, as a result, temperatures of a substrate (e.g., the substrate 107). Current, voltage and/or power provided to the heating elements 110, 111, 112 and/or other heating elements may be independently controlled and based on a temperature control algorithm. The temperature control algorithm may be executed by the temperature controller 142 and executed to determine current, voltage and/or power settings based on dimensions and locations of thermal voids to provide target temperature gradients across the top plate 102D and as a result across the substrate 107. The temperature controller 142 controls current supplied to the heating elements based on detected parameters from the above-stated temperature sensors and/or temperature sensors 143 within the processing chamber 104. The current and/or power may be supplied independently to the heating elements. The temperature sensors 143 may include resistive temperature devices, thermocouples, digital temperature sensors, and/or other suitable temperature sensors. During a deposition process, the substrate 107 may be heated in presence of high-power plasma.

The substrate processing system 100 further includes a vacuum system 150 that includes a vacuum controller 152. Although shown separately from the temperature controller 142 and the system controller 160, the vacuum controller 152 may be implemented as part of the temperature controller 142 and/or system controller 160. The vacuum controller 152 controls operation of a valve 156 and a vacuum pump assembly 158. The vacuum pump assembly 158 may include one or more pumps and be controlled to vacuum clamp the substrate 107 to the body 102 and/or to evacuate the processing chamber 104. The valve 156 and the vacuum pump assembly 158 may be used to evacuate reactants from the processing chamber 104. The vacuum controller 152 and/or the system controller 160 may also control flow of a back side gas supplied to the backside of the substrate 107 by controlling operation of the valve 159 and the vacuum pump assembly 158 to control gas composition behind the substrate 107 and aid in thermal conductivity between the substrate support 101 and the substrate 107.

The system controller 160 may control components of the substrate processing system 100 including controlling supplied RF power levels, pressures and flow rates of supplied gases, RF matching, etc. The system controller 160 may control states of the valve 156 and the vacuum pump assembly 158. A robot 164 may be used to deliver substrates onto, and remove substrates from, the substrate support 101. For example, the robot 164 may transfer substrates between the substrate support 101 and a load lock 166. The robot 164 may be controlled by the system controller 160. The system controller 160 may control operation of the load lock 166.

The valves, gas pumps, power sources, RF generators, etc. referred to herein may be referred to as actuators. The heating elements, thermal voids, gas channels, gas grooves, etc. referred to herein may be referred to as temperature adjusting elements.

The substrate support 101 may further include a minimum overlap exclusion ring (MOER) 170. Example minimum overlap exclusion zone rings are shown in U.S. Pat. No. 5,882,417, titled "Apparatus for Preventing Deposition on Frontside Peripheral Region and Edge of Wafer in Chemical Vapor Deposition Apparatus", filed Dec. 31, 1996. Exclusion gas (e.g., argon and optionally hydrogen) may be supplied to an annular open area between the MOER, the top plate 102D and the outer circumferential edge of the substrate 107. A groove 172 in the top plate 102D may receive the exclusion gas from, for example, the manifold and valve assembly 140 via the support column 103. The exclusion gas is provided to prevent tungsten from depositing on an outer edge and/or backside of the substrate 107 during processing.

Although the substrate supports of FIGS. 1-11B are each shown as having certain features and not other features, each of the substrate supports may be modified to include any of the features disclosed herein and in FIGS. 1-11B.

Figure 2:
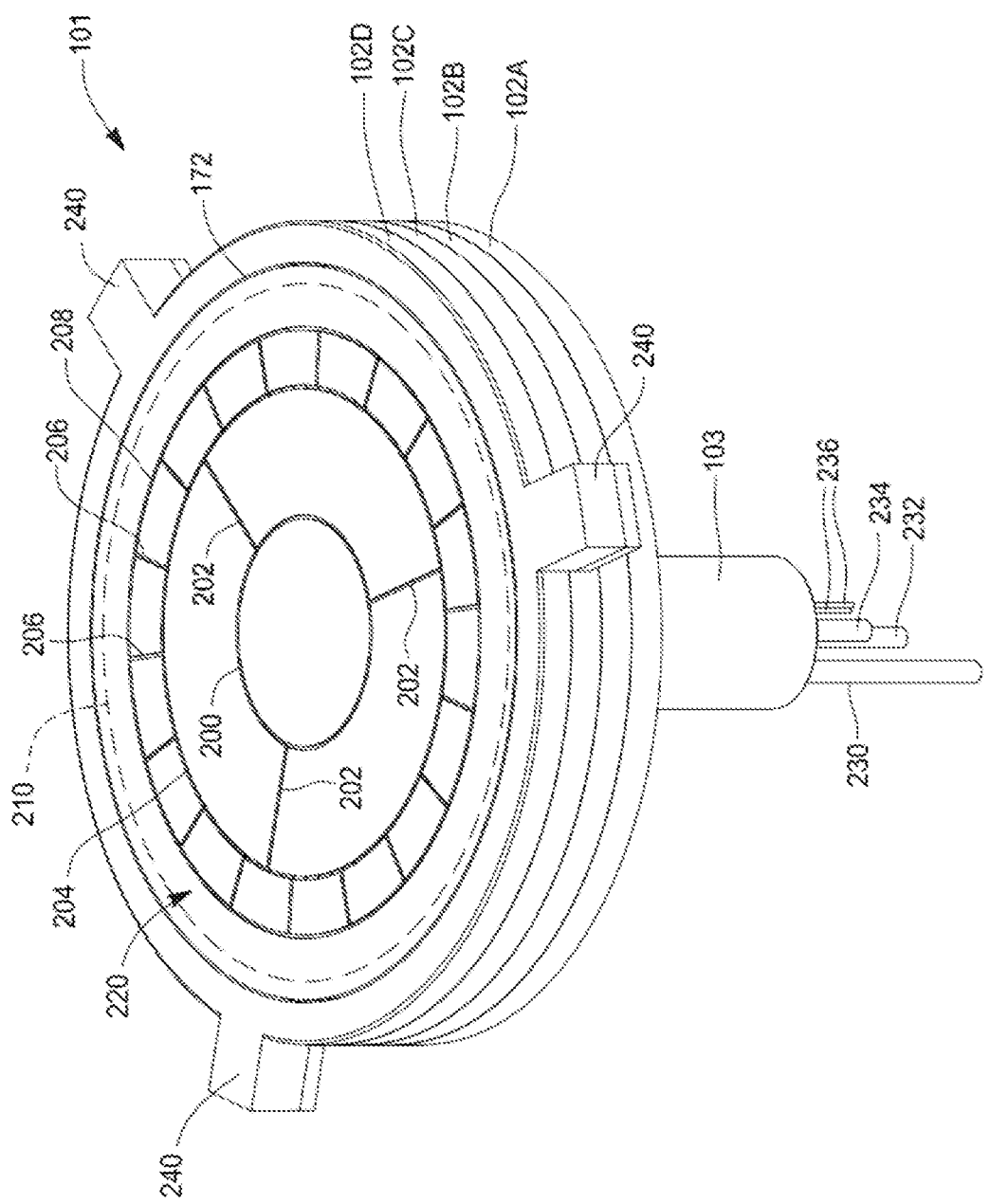
FIG. 2 is a top perspective view of the substrate support of FIG. 1.
Figure 3:
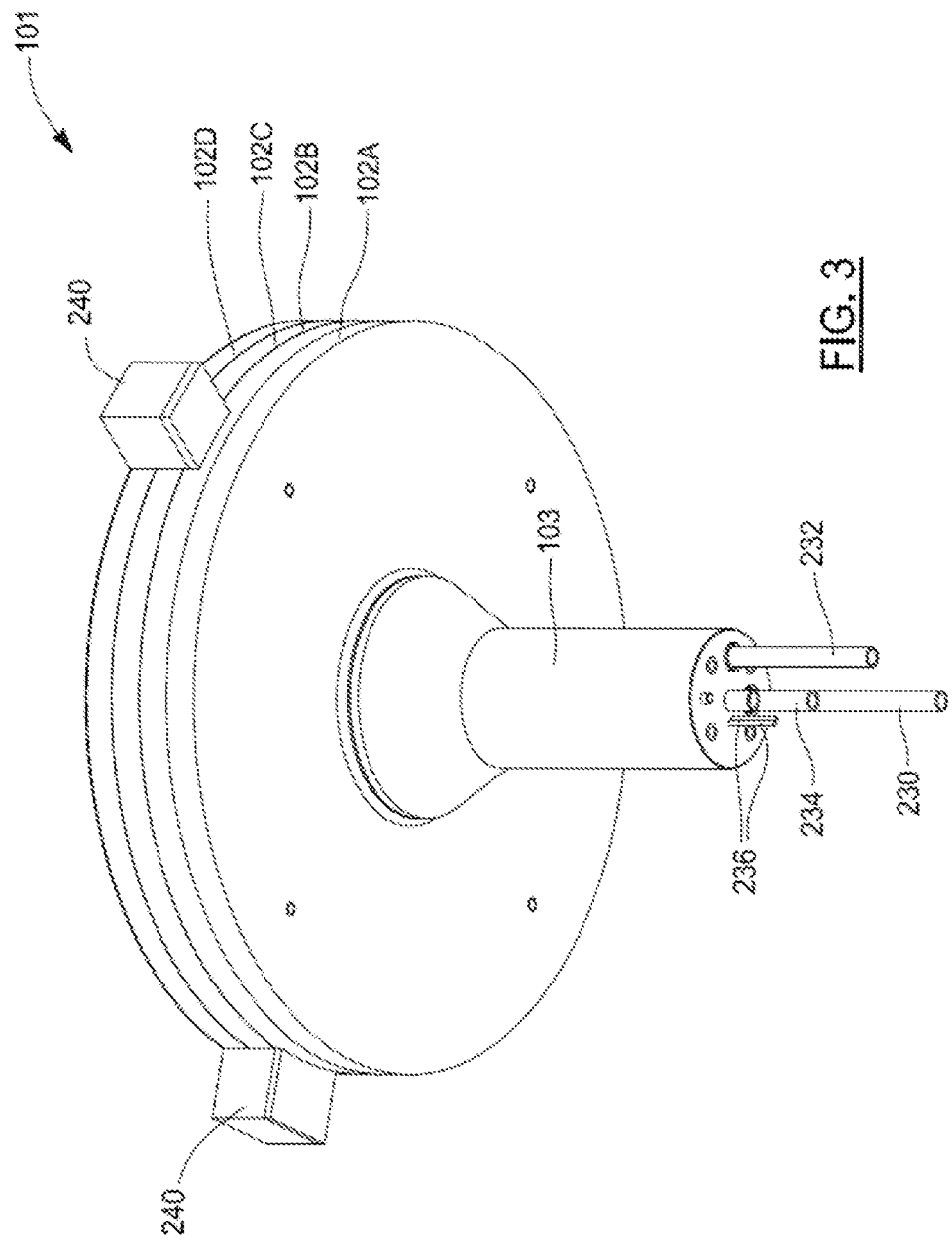
FIG. 3 is a bottom perspective view of the substrate support of FIG. 1.

FIGS. 2-3 show views of the substrate support 101 including the plate layers 102A, 102B, 102C, 102D and the support column 103. The plate layers 102A, 102B and 102D are hereinafter also referred to as "plates". The top plate 102D includes an inner circular vacuum groove 200, first radially extending vacuum grooves 202, a middle circular vacuum groove 204, second radially extending vacuum grooves (some of which are designated 206) and an outer circular vacuum groove 208. The grooves 200, 202, 204, 206, 208 are in a symmetric, annular and radial pattern to provide a symmetric, annular and radial vacuum clamping pattern. A substrate (represented by dashed circle 210), is vacuum clamped to the top plate 102D by providing a vacuum between the top plate 102D and a substrate via the grooves 200, 202, 204, 206 and 208, which provide a vacuum clamping pattern. The first radially extending vacuum grooves 202 extend from the inner circular vacuum groove 200 to the middle circular vacuum groove 204. The second radially extending vacuum grooves 206 extend from the middle circular vacuum groove 204 to the outer circular vacuum groove 208.

The grooves 204 and 208 are closer together than the grooves 200 and 204. In addition, the number of the second radially extending vacuum grooves 206 is more than the number of the first radially extending vacuum grooves 202. The vacuum grooves 206 are shorter and there are more of them as the only leak path into the vacuum clamping area is from the outer circumferential edge of a substrate. There is no leak path to an inner portion of the vacuum clamping pattern, which may refer to grooves the 200 and 202. For this reason, there is little thermal conductivity associated with the passages of the inner portion. The passages show up as thermal non-uniformity areas because of the lack of contact with the substrate. As a result the number of the passages (or grooves) are minimized. Also, with the leak path from the outer circumferential edge, gas is pumped away efficiently to not cause a pressure gradient under the substrate as this can also change thermal conductivity. These stated groove relationships provide efficient pumping of gas in an outer annular area near an outer periphery of the substrate 210 to pull an outer annular area 220 of the substrate 210 to the top plate 102D with increased force and as a result flatten the substrate 210 for processing. This is accomplished without providing a pressure gradient under the substrate. Large diameter substrates can be concave shaped (or bowed) having, when set on the top plate 102D, a center that is in contact with the top plate 102D and a peripheral edge, which is not in contact with the top plate 102D. The vacuum groove pattern aids in flattening the substrate 210 for improved processing.

The support column 103 includes channels for gas pipes and passage of heating elements. Three pipes 230, 232, 234 are shown. The first pipe 230 may be used to provide the above-described vacuum. The second pipe 232 may be used to provide the above-stated exclusion gas. The third pipe 234 may be used for a thermocouple. An example thermocouple is shown in FIG. 6. The pipes are further shown in FIGS. 4-7. Input and output ends 236 of the inner heating element 110 of FIG. 1 is shown. The heating elements are further shown in FIGS. 4, 6 and 8A.

The top plate 102D further includes the outer circular exclusion gas groove 172, which is used to supply exclusion gas along an outer edge of the substrate 210. The substrate support 101 includes ears 240 that are used to locate one or more exclusion gas rings, such as the MOER 170 of FIG. 1. The ears 240 have associated heat loss, which is accounted for by protrusions in an outermost winding of an outermost heating element, which is shown in FIG. 8A.

Figure 4:
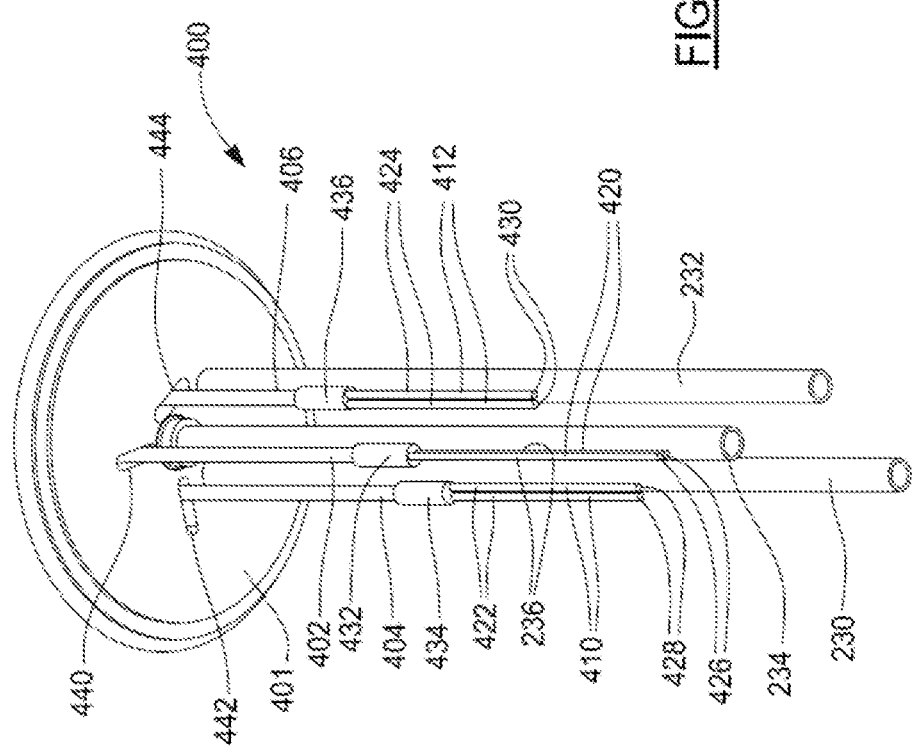
FIG. 4 is a bottom perspective view of a portion of the substrate support of FIG. 1 illustrating a vacuum pipe, an exclusion gas inlet pipe, a thermocouple pipe, and heating element ends in accordance with an example of the present disclosure.

FIG. 4 shows a portion 400 of the substrate support 101 located within the support column 103 shown in FIGS. 1-3. The substrate support 101 includes the three pipes 230, 232, 234. The pipes 230, 232, 234 are respectively a vacuum pipe, an exclusion gas inlet pipe, a thermocouple pipe. The pipes 230, 232, 234 extend out from a center area 401 of the bottom plate layer 102A of FIGS. 1-3. The substrate support 101 further includes the three heating elements 110, 111, 112 of FIG. 1, which respectively have outer tubes 402, 404, 406 and input and output ends 236, 410, 412. The input and output ends 236, 410, 412 include insulation tubes 420, 422, 424 and inner conductive elements 426, 428, 430, which receive power from the power source 144 of FIG. 1 and return power to the power source 144. The outer tubes 402, 404, 406 may be formed of aluminum and may include sealing portions 432, 434, 436. The outer tubes 402, 404, 406 extend out from respective slots 440, 442, 444 in the center area 401. Each of the heating elements 110, 111, 112 has a single associated port (or hole) through which input and output portions of the heating elements 110, 111, 112 pass through. For example, the input and output portions of the heating element 110 pass through the same slot 440 (or hole) in the bottom plate 102A rather than through two separate holes in the bottom plate 102A. This provides a simplified design and allows the associated coils to be in a more symmetric and concentric relationship while minimizing the number of input and output ports. These relationships aid in reducing and/or eliminating temperature azimuthal non-uniformities.

Figure 5:
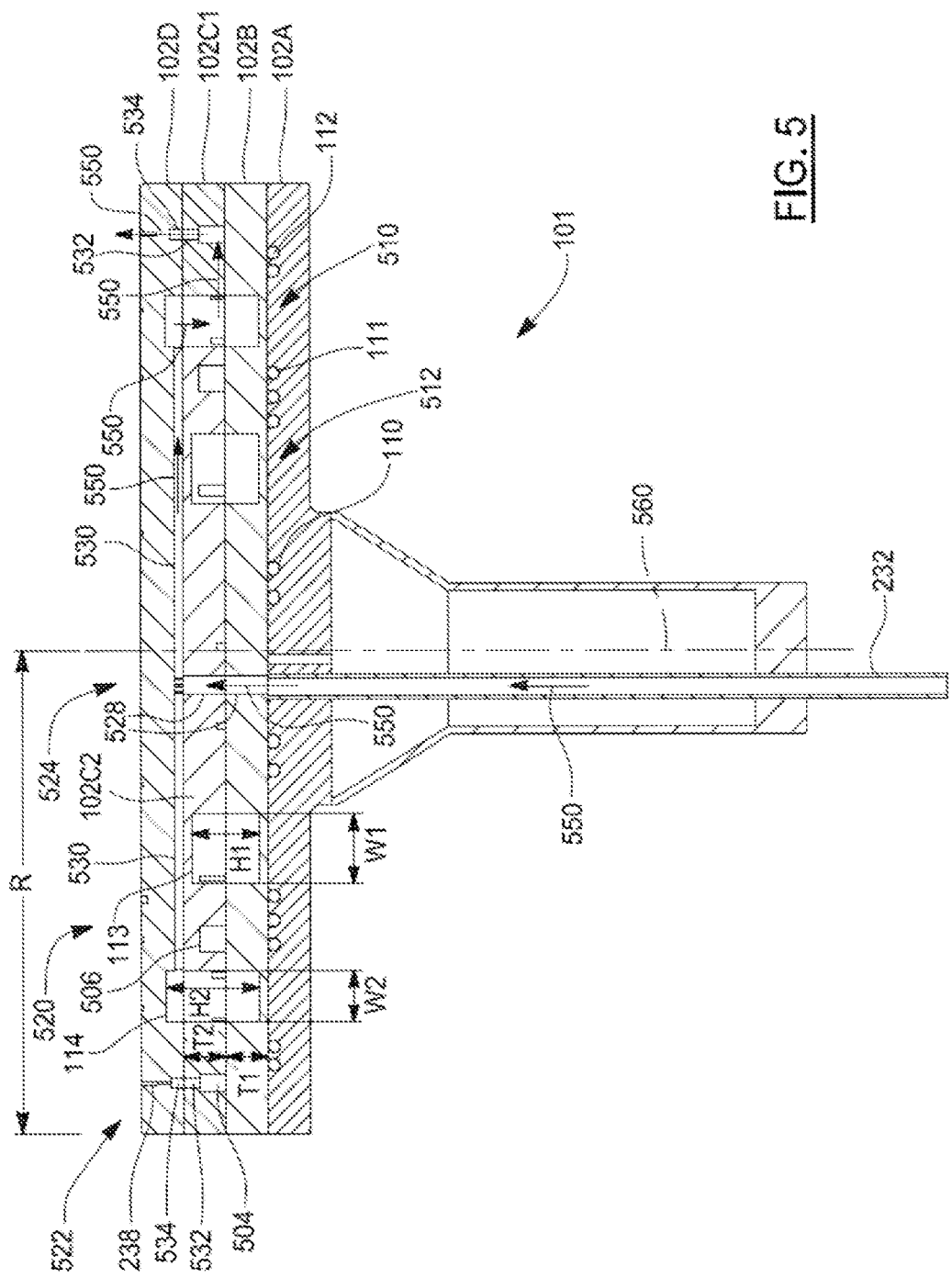
FIG. 5 is a cross-sectional view of the substrate support of FIG. 1 illustrating thermal voids and an exclusion zone gas path in accordance with an example of the present disclosure.

FIG. 5 shows a cross-section of the substrate support 101 including the plate layers 102A-D. The plate layer 102C includes an outer plate 102C1 and an inner plate 102C2. The plate layers 102B-D include one or more thermal voids, which may be of various sizes, shapes and patterns. Any number of thermal voids may be included. Each of the thermal voids are circular-shaped and serves multiple purposes.

In the example shown, two large thermal voids 113, 114 and two small thermal voids 504, 506 are shown. Each of the thermal voids 113, 114, 504, 506 include an upper surface and lower surface, an inner surface and an outer surface, which are circular-shaped and defined by corresponding ones of the plates 102A-D. The thermal voids 113, 114, 504, 506 may be implemented as annular-shaped manifolds having corresponding inputs and outputs. In one embodiment, the thermal voids 113, 114, 504, 506 provide a temperature gradient of greater than or equal to 2° C. In another embodiment, the thermal voids 113, 114, 504, 506 greater than or equal to 2° C.

The thermal voids 113, 114 are defined by multiple layers, for example, the plate layers 102B-D. The inner thermal void 113 is defined by plates 102B, 102C2 and 102D. The outer thermal void 114 is defined by plates 102B, 102C1 and 102D. The thermal voids 113, 114 may have a rectangular-shaped cross-section or a different shaped cross-section. The thermal void 113 is horizontally oriented, such that the longer cross-sectional sides of the thermal void 113 extend horizontally. The thermal void 114 is vertically oriented, such that the longer cross-sectional sides of the thermal void 114 extend vertically.

The thermal voids 114, 113 are disposed respectively above annular areas 510, 512 of the bottom plate 102A. The annular area 510 is disposed between the heating elements 111, 112 and the annular area 512 is between the heating elements 110, 111. The thermal voids 113, 114 are configured and disposed to provide larger thermal gradients between a peripheral annular area 522 and a center area 524 and of the substrate support 101. The thermal voids 113, 114 may also provide a temperature gradient between a middle annular area 520 and the annular areas 522 and 524 of the substrate support 101.

The thermal voids 504, 506 are in a single plate layer, for example, the plate layer 102C. The outer thermal void 504 is in the outer plate 102C1 and the inner thermal void 506 is in the inner plate 102C2. The thermal voids 504, 506 are defined by two plate layers 102B and 102C. A gap exists between the plates 102C1 and 102C2 and is part of the thermal void 114.

The outer thermal voids 114 and 504 may be used to supply the exclusion gas received via the pipe 232 to the exclusion gas groove 172 of FIG. 2. An exclusion gas path is shown and includes the pipe 232, holes 528 in plates 102B and 102C2, grooves (or channels) 530, the thermal voids 114, 504, holes 532 in plate 102C1, holes 534 in plate 102D and the exclusion gas groove 172. Gas flow along the exclusion gas path is represented by arrows 550. Although some of the arrows 550 are shown for gas flow in a single radial direction, the exclusion gas flows from the pipe 232 radially outward in multiple directions via the channels 530.

In the example shown, the thermal voids 113, 114 have certain cross-section dimensions. These dimensions have certain relationships relative to each other and relative to dimensions of the plates 102A-102D. These dimensions and relationships are provided as an example and may be different than shown. In the example shown, the cross-section of the thermal void 113 has a height H1 and a width W1 and the cross-section of the thermal void 114 has a height H2 and a width W2. The height H2 may be greater than the width W2. The height H1 may be equal to the width W1. The height H2 may be greater than the height H1. The width W1 may be greater than the width W2. The height H2 may be greater than a sum of the thicknesses T1 and T2 of the plates 102B and 102C. The height H1 may be greater than a thickness of one of the plates 102B and 102C, but less than a sum of the thicknesses T1 and T2. In one embodiment, a sum of the widths W1, W2 is greater than 20% a radius R of the plates 102A-D. The radius R is measured from a centerline 560 to an outer circumferential edge of the plates 102A-D. In another embodiment, a sum of the widths W1, W2 is greater than 25% the radius R. In an embodiment, the width W1 is 5-15% the radius R and the width W2 is 10-20% the radius R. In another embodiment, the width W1 is 10% the radius R and the width W2 is 15% the radius R. In another embodiment, the thermal void 113 has the cross-section dimensions H2, W2 and the thermal voids 114 has the cross-section dimensions H1, W1.

The dimensions and locations of the thermal voids 113, 114 504, 506 are set to provide a temperature distribution profile with target temperature gradients across a top surface of the top plate 102D. Example temperature gradients are shown in FIGS. 13-14 and 16-17. Changing the sizes and locations of the thermal voids alters the temperature profile across the top surface of the top plate 102D. Increasing the volumes of the thermal voids 113, 114 504, 506, can increase the temperature gradients radially across the top plate 102D. In the example shown, the thermal void 113 is wider and has a smaller height than the thermal void 114 and provides a gradual reduction in temperature in a corresponding area of the substrate support 101. The thermal void 114 has a larger height and a smaller width than the thermal void 113 and provides a large drop off in temperature in a corresponding area of the substrate support 101. These and other dimensional relationships may be provided to control the radial temperature gradients and the rates of radial temperature change relative to radial distances from a center of the substrate support 101.

FIG. 6 shows another cross-section of the substrate support 101, which includes the plate layers 102A-D, the heating elements 110, 111, 112, the tubes 402, 406, the input and output ends 236, 412, and the thermal voids 113, 114, 504, 506. FIG. 6 shows a portion of the exclusion zone path represented by the arrows 550. The exclusion zone path extends from the thermal void 114 to the thermal void 504 by radially extending channels (one of which is shown in FIG. 6 and designated 600).

FIG. 6 also shows a portion of a vacuum path represented by arrows 602. FIG. 7 also provides an example of the vacuum path. The vacuum path begins at the grooves 200, 202, 204, 206, and 208 (best shown in FIGS. 2 and 11A) of the top plate 102D and includes holes 610, 612 in the plates 102D, 102C2 and inner thermal void 506.

In the example shown, the substrate support 101 further includes the thermocouple 145 that extends in the pipe 234 to a center of the plate 102C2. The thermocouple 145 provides a temperature signal indicative of a temperature in a center area 622 of the plate 102C2. The temperature signal is provided to the temperature controller 142 of FIG. 1.

The tubes 402, 406 extend vertically in the support column 103 and then horizontally in the bottom plate 102A to the windings of the heating elements 110, 111, 112, which are in the bottom plate 102A and disposed between the plates 102A and 102B such that the heating elements 110, 111, 112 contact both plates 102A and 102B.

The tubes 402, 406 extend into the bottom plate 102A and radially to the corresponding coils 110, 112. A radially extending portion 624 of the tube 406 is shown. In an embodiment, the tubes 402, 406 and the other tube 404 (shown in FIG. 5) extend radially to winding portions and then are wound in circular patterns to provide coils.

During operation, pressure within the support column 103 may be at an atmosphere pressure, whereas pressure outside of the stem may be under vacuum. By having the pressure within the stem be at an atmospheric pressure, the thermocouple 145 and the corresponding inner portions of the plate 102C2 are also at atmospheric pressure, which results in greater thermal conductivity between the thermocouple and the plate 102C2. This aids in assuring that the thermocouple 145 provides an accurate signal output. This is unlike when under vacuum, where thermal conductivity between a thermocouple and a corresponding plate is reduced, which tends to result in measurement errors.

FIG. 7 shows another cross-section of the substrate support 101, which includes the plate layers 102A-D, the heating elements 110, 111, 112, the pipe 230, and the thermal voids 113, 114, 504, 506. FIG. 7 illustrates a portion of a vacuum path, represented by arrows 700. Vacuum is provided to draw gas from the thermal void 113 via radially extending grooves (or channels) 702 to the pipe 230.

The plates 102A-D are bonded to each other in a manner such that the plates 102A-D provide a solid unitary body. This seals the disclosed channels, grooves, manifolds, and/or passages at least partially enclosed by the plates 102A-D and provides thermal conductivity between the plates 102A-D.

Figure 8B:
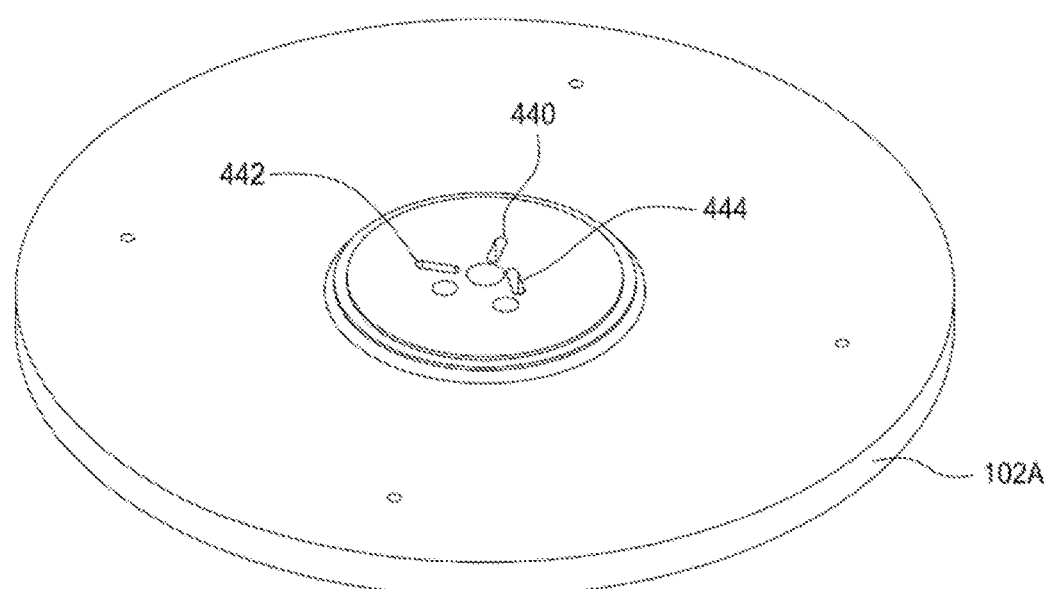
FIG. 8B is a bottom perspective view of the bottom plate layer of FIG. 8A.

FIGS. 8A and 8B show the bottom plate layer 102A of the substrate support 101. The bottom plate layer 102A includes channels 800, 802, 804 for windings 806, 808, 810 of the heating elements 110, 111, 112. Each set of corresponding windings of a same heater element is referred to as a coil. Coils provided by the windings 806, 808, 810 are designated 820, 822, 824. The coils 820, 822, 824 may be circular-shaped. In one embodiment, the windings 806, 808, 810 and the coils 820, 822, 824 are concentric. The inner coil 920 is surrounded by the middle coil 822, which is surrounded by the outer coil 824.

The heating elements 110, 111, 112 include radially extending portions 812, 814, 624. The outer heating element 112 includes protruding portions 818 that extend radially outward to provide additional heating near the ears 240 of FIG. 2 to compensate for the heat radiated from the ears 240. This aids is maintaining areas near the ears at a same temperature as or within a predetermined temperature of other areas along a periphery of the plate 102A.

The radially extending portions 812, 814, 624 provide minimal to no heating. This is unlike the windings 806, 808, 810, which are configured to radiate heat. The radially extending portions 812, 814, 624 have larger cross-sections and lower resistance than the windings 806, 808, 810, which causes the radially extending portions 812, 814, 624 to not generate heat.

The portions of the conductive elements of the heating elements that are in the radially extending portions 812, 814, 624 may be formed of a different material than the portions of the conductive elements in the windings 806, 808, 810. As an example, the portions of the conductive elements in the radially extending portions 812, 814, 624 may be formed of nickel (Ni) and the portions of the conductive elements in the windings 806, 808, 810 may be formed of nickel-chromium (NiCr). FIG. 8B shows the slots 440, 442, 444 for the heating elements 110, 111, 112.

Figure 9A:
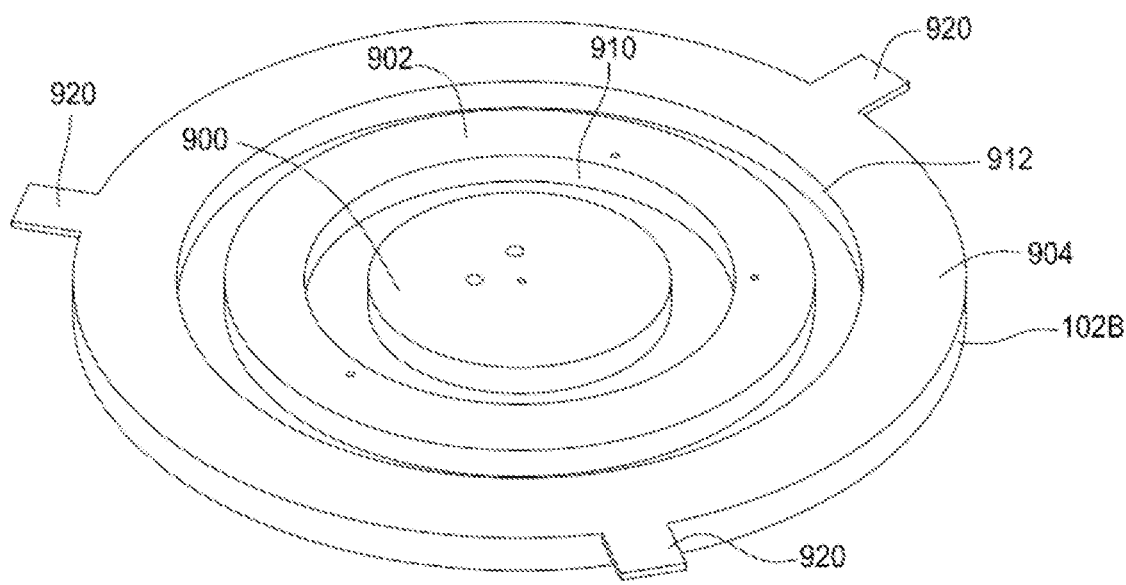
FIG. 9A is a top perspective view of a first intermediate plate layer of the substrate support of FIG. 1 in accordance with an example of the present disclosure.
Figure 9B:
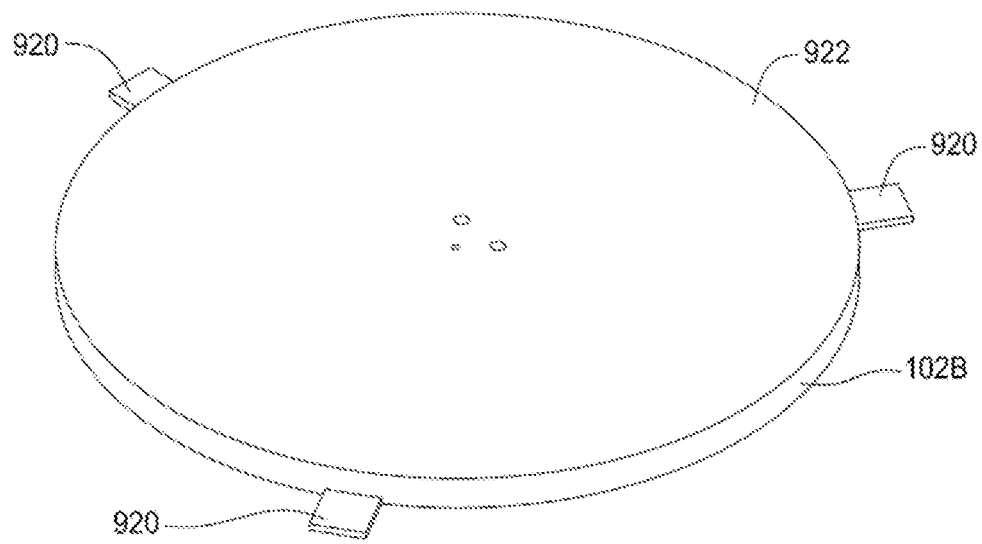
FIG. 9B is a bottom perspective view of the first intermediate plate layer of FIG. 9A.

FIGS. 9A and 9B show the plate layer 102B (referred to as a first intermediate plate layer) of the substrate support 101. The plate layer 102B includes three sections 900, 902, 904 separated by two annular-shaped channels 910, 912, which define bottom portions of the thermal voids 113, 114 of FIGS. 1 and 5-7. The outer section 904 includes bottom portions 920 of the ears 240 of FIG. 2. The section 900 is disc-shaped and the sections 902, 904 are ring-shaped. The sections 900, 902, 904 extend horizontally from a base portion 922. The annular-shaped channels 910, 912 are defined by the sections 900, 902, 904 and the base portion 922. The annular-shaped channels 910, 912 may be in a symmetric and concentric pattern as shown.

Figure 10A:
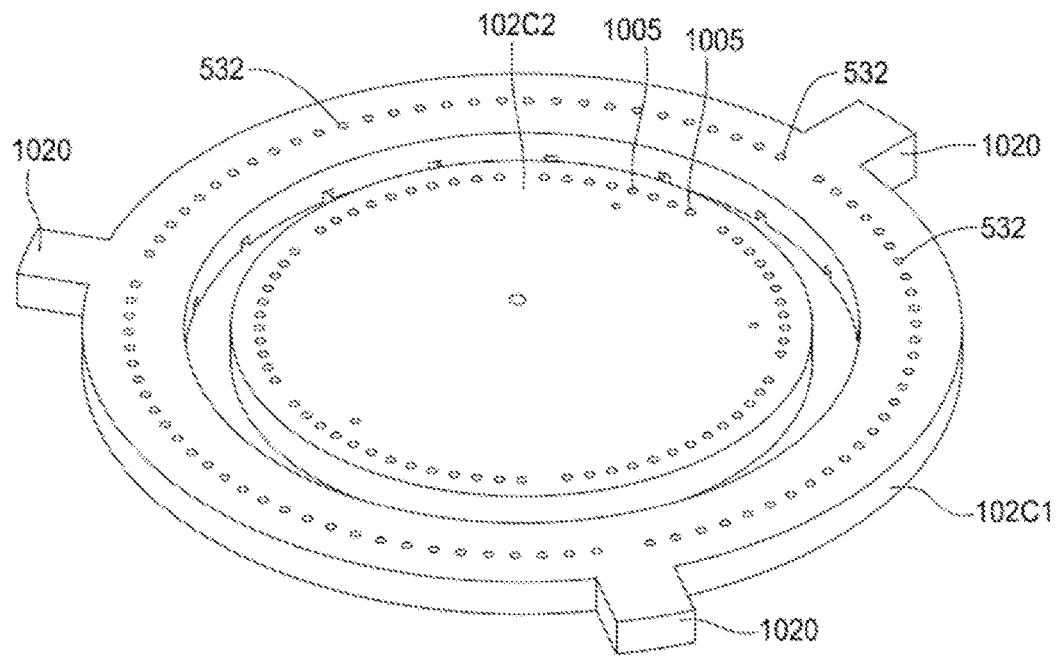
FIG. 10A is a top perspective view of a second intermediate plate layer of the substrate support of FIG. 1 in accordance with an example of the present disclosure.
Figure 10B:
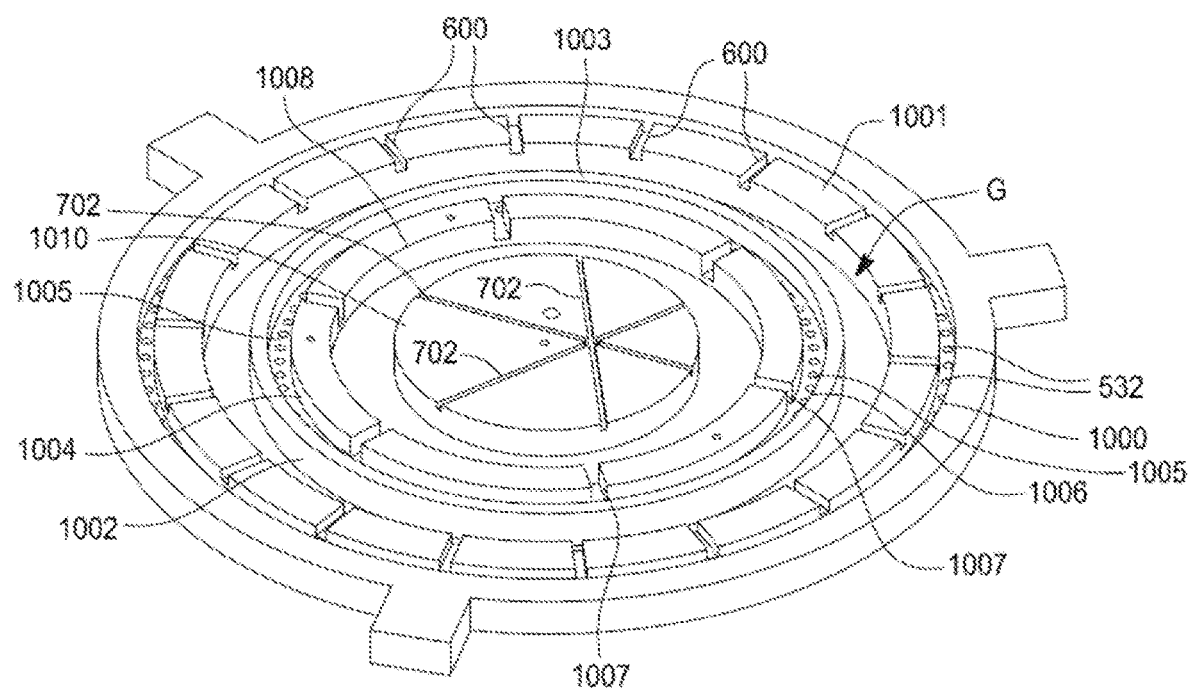
FIG. 10B is a bottom perspective view of the second intermediate plate layer of FIG. 10A.

FIGS. 10A and 10B show the plates 102C1 and 102C2, which are part of a second intermediate plate layer 102C of the substrate support 101. The plate 102C1 is ring-shaped body and includes the holes 532, a channel 1000 defining a portion of the thermal void 504 of FIGS. 5-7, and radially extending channels 600. The radially extending channels 600 extend along a bottom portion of a radially inner section 1001 of the ring-shaped body. Exclusion gas passes from a gap G between the plates 102C1, 102C2 through the channels 600 to the channel 1000 and through the holes 532.

The plate 102C2 includes a body 1002 including an outer section 1003, a middle section 1004, holes 1005, channel 1006, radially extending channels 1007, a channel 1008, and a center section 1010 with the grooves 702. Gas is drawn by vacuum from the holes 1005 through the channel 1006, which defines a portion of the thermal void 506 of FIGS. 5-7, through the channels 1007 and into the channel 1008. The gas in the channel 1008 may be drawn through the grooves 702 to the pipe 230 of FIGS. 2 and 7. An end of the pipe 230 may be located below a point where the grooves 702 cross. The vacuum path may be received when supplying a backside gas to the area between the substrate support 101 and the substrate 107 of FIG. 1. The channel 1008 defines a top portion of the thermal void 113 of FIGS. 1 and 5-7. The plate 102C1 may include intermediate ear sections 1020 that provide a portion of the ears 240 of FIG. 2.

The channels 600 and 1007 may be in a symmetric radially extending pattern as shown. The channels 600 may be equally spaced apart from each other. The channels 1007 may also be equally spaced apart from each other. The gap G and the channels 1000, 1006, 1008 may be in a symmetric and concentric pattern as shown. The holes 532 are collectively arranged in a first circular pattern and the holes 1005 are arranged in a second circular pattern. The holes 532 and 1005 may also be in a symmetric and concentric pattern as shown. The grooves 702 may not be in a symmetrical pattern in order to offset the pipe 230 from the center of the substrate support 101.

Figure 11A:
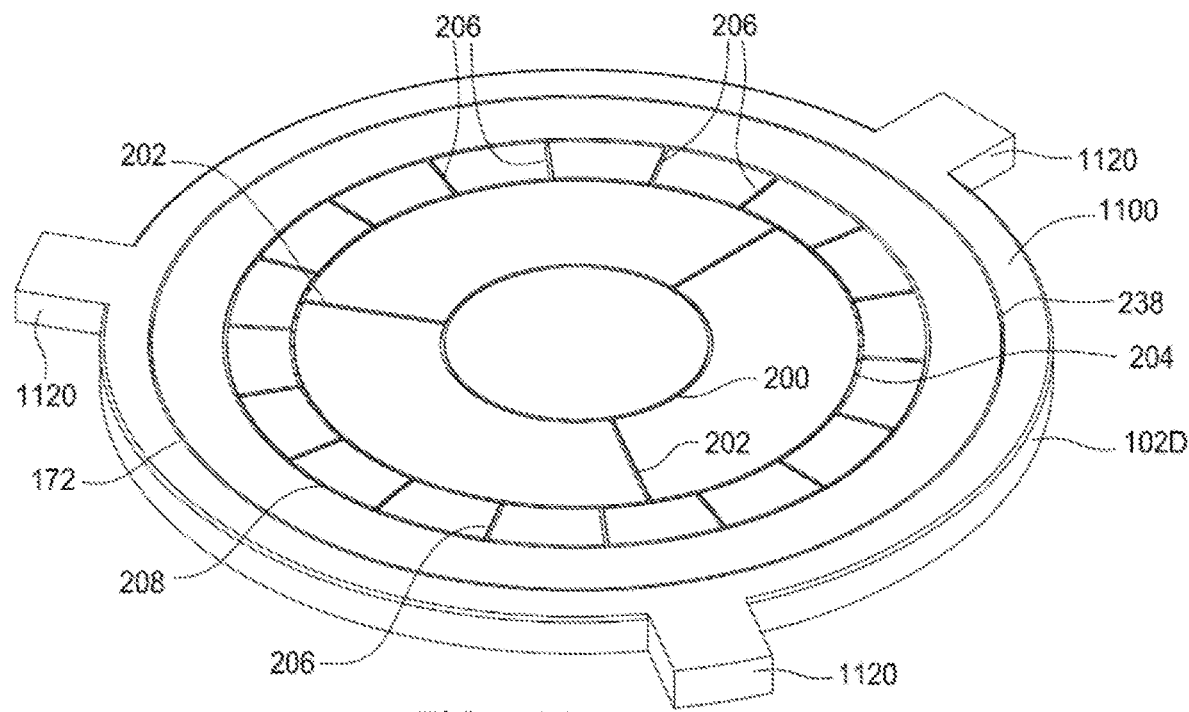
FIG. 11A is a top perspective view of a top plate layer of the substrate support of FIG. 1 in accordance with an example of the present disclosure.
Figure 11B:
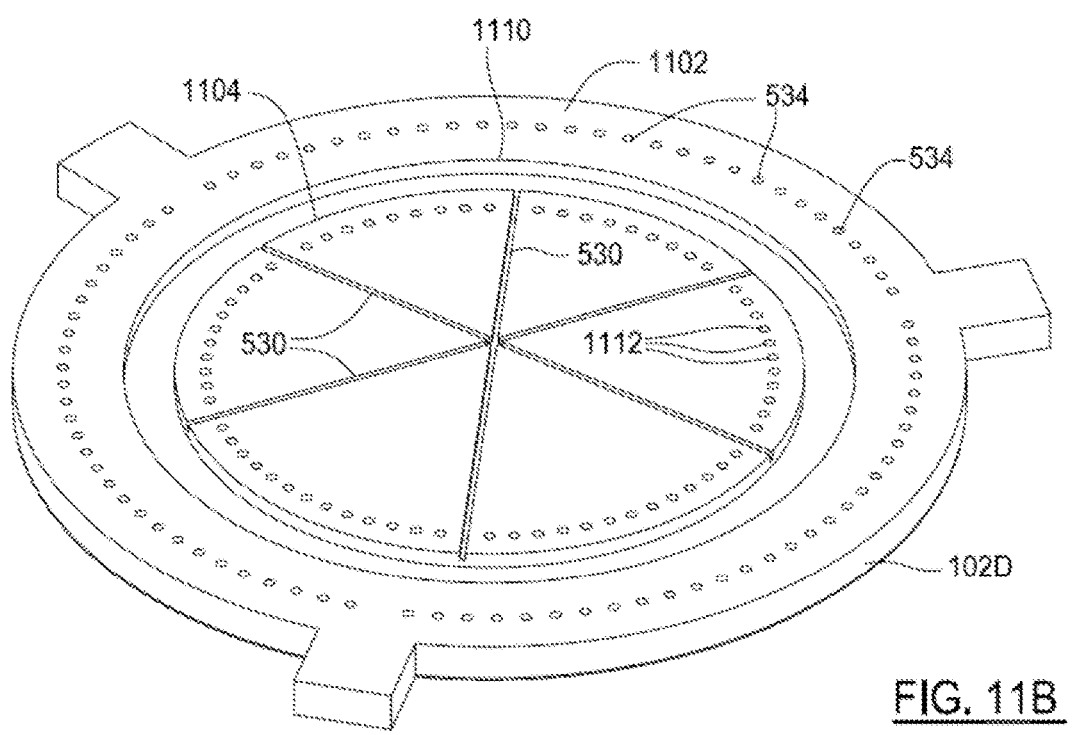
FIG. 11B is a bottom perspective view of the top plate layer of FIG. 11A.

FIGS. 11A and 11B show the top plate 102D of the substrate support 101. The top plate 102D includes (i) a main top section 1100 that includes the grooves 172, 200, 202, 204, 206, 208, (ii) a ring-shaped outer section 1102, and (iii) a center section 1104. The sections 1102, 1104 extend down from the main top section 1100 and define an annular-shaped channel 1110, which defines a top portion of the thermal void 114 of FIGS. 1 and 5-7. The section 1102 includes the holes 534. The center section 1104 includes holes 1112 and the grooves 530. The holes 1112 are in alignment with respective ones of the holes 1005 of FIG. 10A. Gas drawn from the groove 204 of FIG. 11A passes through the holes 1112 and 1002. The grooves 530 provide the exclusion gas from the pipe 232 of FIGS. 2-5 to the channel 1110. An end of the pipe 232 may be below a point where the grooves 530 cross. The top plate 102D may include top ear sections 1120 that provide a top portion of the ears 240 of FIG. 2.

The grooves 202 may be equally spaced apart from each other. The grooves 206 may be equally spaced apart from each other. The holes 534 may be arranged in a first circular pattern. The holes 1112 may be arranged in a second circular pattern. The grooves 530 may be arranged in a symmetric pattern providing equally sized "pie"-shaped sections surfaces in a bottom of the center section 1104 as shown or the grooves may not be symmetric in order to offset the pipe 232 from the center of the substrate support 101.

Figure 12:
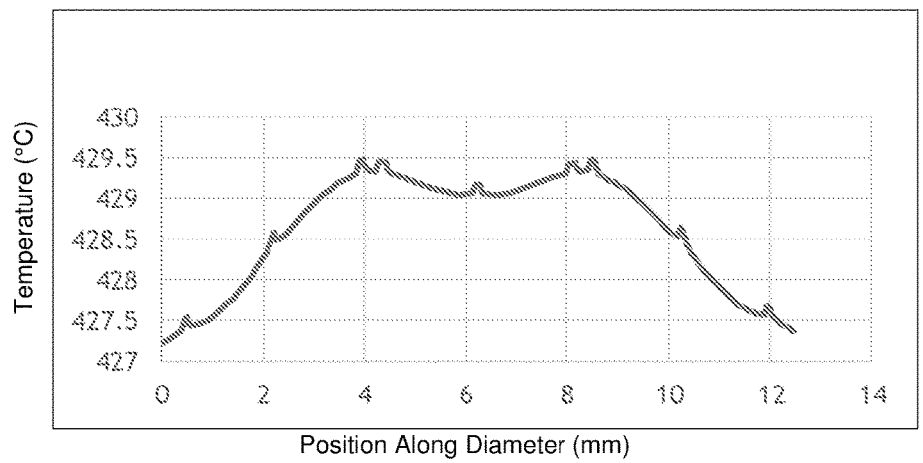
FIG. 12 is an example plot of temperature versus position along a diameter of a traditional substrate support including a single heating element.

FIG. 12 shows a plot of temperature versus position along a diameter of a traditional substrate support including a single heating element. In this example, the temperature gradient provided is approximately 2° C. In this example, the outer peripheral edge of the substrate support 101 is cooler than an annular middle and center sections of the substrate support 101. The center section is cooler than the annular middle section, but hotter than the outer peripheral edge.

Figure 13:
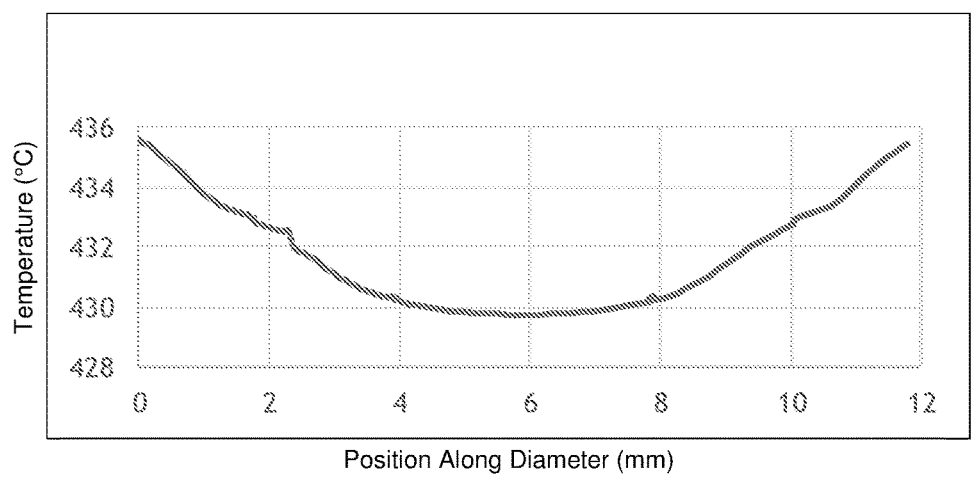
FIG. 13 is an example plot of temperature versus position along a diameter of the substrate support of FIG. 1 operated in an edge hot mode in accordance with an example of the present disclosure.
Figure 14:
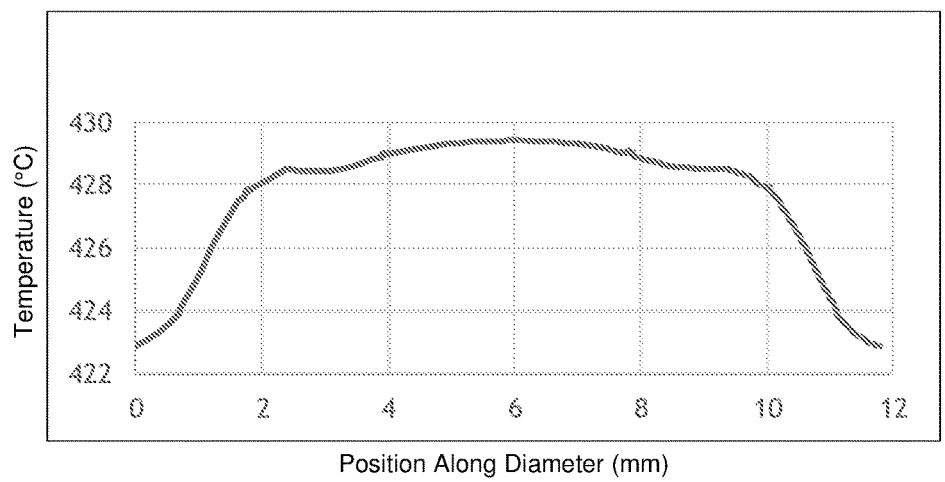
FIG. 14 is an example plot of temperature versus position along a diameter of the substrate support of FIG. 1 operated in an edge cold mode in accordance with an example of the present disclosure.

The substrate support 101 of FIG. 1 includes multiple heating elements and thermal voids and may be operated accorded to multiple different operating modes. In one embodiment, the substrate support 101 is operated in an edge hot mode or an edge cool mode. While operating in the edge hot mode, the outer peripheral edge of the substrate support is at a higher temperature than a center section of the substrate support. FIG. 13 shows a plot of temperature versus position along a diameter of the substrate support 101 while operating in the edge hot mode. As shown, a temperature gradient between the peripheral edge and a center of the substrate support 101 is approximately 6° C. FIG. 14 shows a plot of temperature versus position along a diameter of the substrate support 101 while operated in the edge cold mode. As shown, a temperature gradient between the peripheral edge and a center of the substrate support is approximately 6° C.

Figure 15:
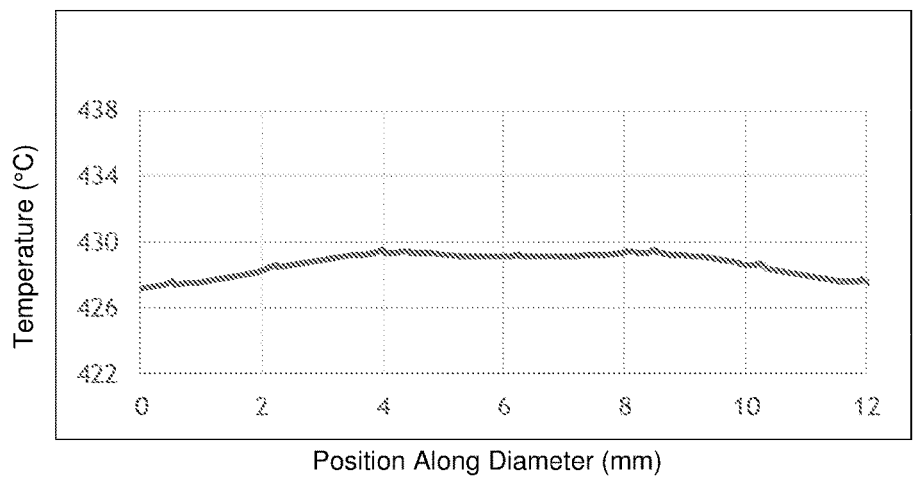
FIG. 15 is another example plot of temperature versus position along a diameter of a traditional substrate support including a single heating element.

FIG. 15 shows another plot of temperature versus position along a diameter of a traditional substrate support including a single heating element. In this example, the temperature gradient provided is approximately 2° C. In this example, the outer peripheral edge of the substrate support 101 is cooler than an annular middle and center sections of the substrate support 101. The center section is cooler than the annular middle section, but hotter than the outer peripheral edge.

Figure 16:
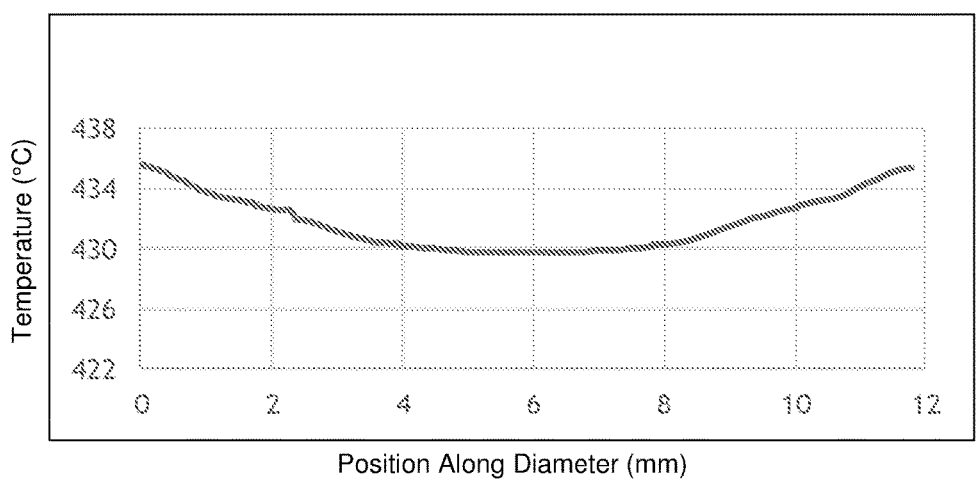
FIG. 16 is another example plot of temperature versus position along a diameter of the substrate support of FIG. 1 operated in an edge hot mode in accordance with of the present disclosure.
Figure 17:
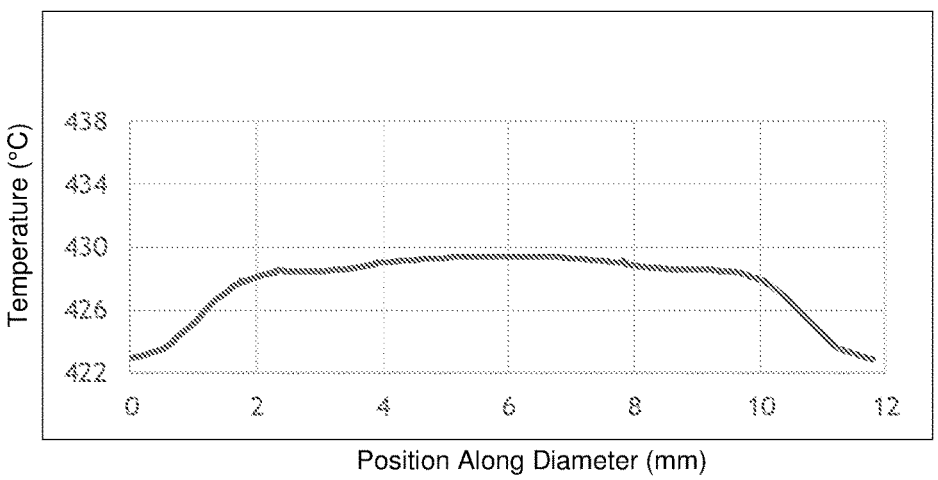
FIG. 17 is another example plot of temperature versus position along a diameter of the substrate support of FIG. 1 operated in an edge cold mode in accordance with an example of the present disclosure.

FIG. 16 shows a plot of temperature versus position along a diameter of the substrate support 101 while operating in the edge hot mode. As shown, a temperature gradient between the peripheral edge and a center of the substrate support 101 is approximately 6° C. FIG. 17 shows a plot of temperature versus position along a diameter of the substrate support 101 while operated in the edge cold mode. As shown, a temperature gradient between the peripheral edge and a center of the substrate support is approximately 6° C.

The above-provided examples allow the temperature profiles in FIGS. 13-14 and 16-17 to be adjusted. This includes controlling rates of radial temperature increase and/or decrease from the center to the outer circumferential edge of the substrate support. The examples allow for providing precise radial temperature gradients and uniform azimuthal temperatures across the substrate support. This allows for precise temperature profile tuning, which is applicable to ALD processing where features (e.g., holes, vias, etc.) need to be filled uniformly across a substrate from center to outer circumferential edge. Temperatures may be varied to vary deposition rates to make the outer circumferential edge thicker or thinner relative to the center. This may be done to make accommodations for a subsequently performed chemical mechanical polishing (CMP) process.

The above-provided examples provide center to edge (radial) deposition profile tuning by controlling an annular and radial temperature profile of a top plate of a substrate support and as a result an annular and radial temperature profile of a substrate. The examples provide a large positive or negative temperature gradient between a center and outer circumferential edge. The gradients allow compensation for other edge effects during processing, such as gas flow, diffusion, and showerhead temperature, which can affect a substrate deposition profile. The examples include an outer thermal void (or break) and exclusion gas manifold and an inner thermal void (or break) vacuum clamping manifold. The examples provide azimuthal temperature uniformity while providing radial temperature gradients. The radial temperature gradients may be azimuthally uniform.

The provided examples allow change in temperature per radial distance across a top plate of a substrate support to be less near a center of the top plate and greater near an outer circumferential edge of the top plate. By providing thermal voids and using the thermal voids as gas distribution manifolds for edge exclusion gas and vacuum clamping, a thermal profile is provided with improved gas flow uniformity for both exclusion gas and vacuum clamping. Use of the inner thermal void as a vacuum clamping manifold allows vacuum clamping ports that provide a greater clamping force during initial moments of clamping to, for example, flatten a bowed substrate. The provided examples include substrate supports with plates formed of a same material and thermal voids as opposed to including plates with areas of different materials, which can have different rates of thermal expansion and contraction and cause cracking.

The provided examples provide additional parameters (e.g., number, size, shape, placement of thermal voids), which are able to be set to provide target temperature profiles. The inclusion of the thermal voids allows other parameters to not be altered and/or altered in a different manner. For example, an amount of hydrogen provided at an outer circumferential edge of a substrate may be maintained or reduced rather than increased as is the case when using a traditional substrate support. An increase in the amount of hydrogen can increase a deposition rate, but cause a negative effect on properties of deposited film. By including the thermal voids, a target temperature at the outer circumferential edge is able to be provided allowing the amount of hydrogen to not be increased.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Although the terms first, second, third, etc. may be used herein to describe various plates, layers, thermal voids, heating elements, conductive elements, channels, grooves, and/or other elements, these plates, layers, thermal voids, heating elements, conductive elements, channels, grooves, and/or other elements should not be limited by these terms, unless otherwise indicated. These terms may be only used to distinguish one plate, layer, thermal voids heating element, conductive element, channel, groove, and/or element from another plate, layer, thermal voids heating element, conductive element, channel, groove, and/or element. Terms such as "first," "second," and other numerical terms when used herein may not imply a sequence or order unless clearly indicated by the context. Thus, a first plate, layer, thermal voids heating element, conductive element, channel, groove, and/or element discussed herein could be termed a second plate, layer, thermal voids heating element, conductive element, channel, groove, and/or element without departing from the teachings of the example embodiments.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support comprising:
a body configured to support a substrate during processing of the substrate, wherein the body comprises a plurality of plates comprising a top plate, a first intermediate plate, a second intermediate plate and a bottom plate, wherein the plurality of plates are arranged to form a stack, and wherein the first intermediate plate is disposed on the second intermediate plate; and
a thermal void defined by an upper recessed surface of the second intermediate plate and at least one of a lower recessed surface of the first intermediate plate or a lower recessed surface of the top plate, wherein the thermal void is annular-shaped.

2. The substrate support of claim 1, wherein the the plurality of plates are bonded together to form a unitary structure with at least partially sealed passages.

3. The substrate support of claim 1, wherein the thermal void is defined by the lower recessed surface of the first intermediate plate and the upper recessed surface of the second intermediate plate.

4. The substrate support of claim 1, wherein the thermal void is defined by the lower recessed surface of the top plate and the upper recessed surface of the second intermediate plate.

5. The substrate support of claim 1, wherein:
the thermal void is a first thermal void;
the first thermal void is defined by the lower recessed surface of the first intermediate plate and the upper recessed surface of the second intermediate plate; and
the body comprises a second thermal void defined by the lower recessed surface of the top plate and the upper recessed surface of the second intermediate plate.

6. The substrate support of claim 1, wherein:
the thermal void is a first thermal void;
the substrate support comprises one or more thermal voids including the first thermal void; and
dimensions of the one or more thermal voids relative to dimensions of at least some of the plurality of plates provides a temperature gradient of greater than 2° C. between a center and an annular outer peripheral area of the body.

7. The substrate support of claim 1, wherein:
the thermal void is a first thermal void;
the substrate support comprises one or more thermal voids including the first thermal void; and
dimensions of the one or more thermal voids relative to dimensions of at least some of the plurality of plates provides a temperature gradient of greater than or equal to 6° C. between a center and an annular outer peripheral area of the body.

8. The substrate support of claim 1, wherein the thermal void is defined by three of the plurality of plates.

9. The substrate support of claim 1, wherein:
the thermal void is a first thermal void;
the body comprises a second thermal void; and
the second thermal void is annular-shaped and defined by a corresponding two or more of the plurality of plates.

10. The substrate support of claim 1, wherein:
the plurality of plates comprise first radially-extending channels and second radially-extending channels; and
the thermal void transfers an exclusion gas between the first radially-extending channels and the second radially-extending channels.

11. The substrate support of claim 10, wherein the first radially-extending channels and the second radially-extending channels are embedded in the plurality of plates.

12. The substrate support of claim 1, wherein:
the plurality of plates comprise radially-extending channels and radially-extending grooves; and
the thermal void transfers gas under vacuum between the radially-extending channels and the radially-extending grooves.

13. The substrate support of claim 1, wherein:
the thermal void is a first thermal void;

the body comprises four annular-shaped thermal voids arranged in a concentric pattern; and the four annular-shaped thermal voids include the first thermal void.

14. The substrate support of claim 1, wherein the plurality of plates comprise two or more concentric heating coils.

15. The substrate support of claim 1, wherein:
the plurality of plates comprise an inner heating element, a middle heating element and an outer heating element;
the thermal void is a first thermal void;
the body comprises a second thermal void;
the first thermal void is disposed above an area between the outer heating element and the middle heating element; and
the second thermal void is disposed above an area between the middle heating element and the inner heating element.

16. The substrate support of claim 15, further comprising:
a third intermediate plate disposed radially inward of the first intermediate plate; and
a fourth intermediate plate disposed between the first intermediate plate and the third intermediate plate,
wherein
at least one of i) heights of the first thermal void and the second thermal void are different, or ii) widths of the first thermal void and the second thermal void are different,
the heights of the first thermal void and the second thermal void are measured from bottoms of the thermal voids to tops of the thermal voids,
the width of the first thermal void is a distance between the first intermediate plate and the third intermediate plate, and
the width of the second thermal void is a distance between the third intermediate plate and the fourth intermediate plate.

17. The substrate support of claim 15, wherein:
a height of the first thermal void is defined by three of the plurality of plates; and
a height of the second thermal void is defined by two of the plurality of plates.

18. The substrate support of claim 15, further comprising:
a third intermediate plate disposed radially inward of the first intermediate plate; and
a fourth intermediate plate disposed between the first intermediate plate and the third intermediate plate,
wherein
at least one of i) a height of the first thermal void is greater than a height of the second thermal void, or
ii) a width of the second thermal void is greater than a width of the first thermal void,
the width of the first thermal void is a distance between the first intermediate plate and the third intermediate plate, and
the width of the second thermal void is a distance between the third intermediate plate and the fourth intermediate plate.

19. A system comprising:
the substrate support of claim 1, wherein the substrate support comprises two or more heating elements and one or more sensors, and wherein the one or more sensors is configured to generate one or more temperature signals; and
a control module configured, based on the one or more temperature signals and a relationship between the thermal void and at least some of the plurality of plates, control supply of at least one of current or power to the two or more heating elements.

20. A substrate support comprising:
a body configured to support a substrate during processing of the substrate, wherein the body comprises a plurality of plates comprising a top plate, a plurality of intermediate plates, and a bottom plate, and wherein the plurality of plates are arranged to form a stack; and
a thermal void defined by the plurality of intermediate plates and extending into each of the plurality of intermediate plates, wherein the thermal void is annular-shaped and concentric with the two or more of the plurality of plates.

21. A substrate support comprising:
a body configured to support a substrate during processing of the substrate, wherein the body comprises a plurality of plate layers comprising a top plate layer, one or more intermediate plate layers, a bottom plate layer, an annular channel, and a plurality of radially extending channels, wherein the one or more intermediate plate layers comprise a first plate and a second plate, wherein the second plate is concentric with the first plate, wherein the plurality of plate layers are arranged to form a stack, and wherein the annular channel and the plurality of radially extending channels extend at least partially within the one or more intermediate plate layers; and
a thermal void defined at least partially by the first plate and the second plate, wherein the thermal void is annular-shaped,
wherein the plurality of radially extending channels fluidically couple the annular channel to the thermal void.

* * * * *